(12) United States Patent
Jang

(10) Patent No.: US 11,915,763 B2
(45) Date of Patent: *Feb. 27, 2024

(54) OPERATING METHOD OF MEMORY SYSTEM INCLUDING MEMORY CONTROLLER AND NONVOLATILE MEMORY DEVICE

(71) Applicant: Samsung Electronics Co., Ltd., Suwon-si (KR)

(72) Inventor: Joonsuc Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 89 days.

This patent is subject to a terminal disclaimer.

(21) Appl. No.: 17/698,056

(22) Filed: Mar. 18, 2022

(65) Prior Publication Data

US 2022/0208271 A1 Jun. 30, 2022

Related U.S. Application Data

(63) Continuation of application No. 17/077,200, filed on Oct. 22, 2020, now Pat. No. 11,309,032.

(30) Foreign Application Priority Data

Nov. 26, 2019 (KR) .................. 10-2019-0153551
Jun. 5, 2020 (KR) .................. 10-2020-0068602

(51) Int. Cl.
*H04L 1/00* (2006.01)
*G06F 11/00* (2006.01)
(Continued)

(52) U.S. Cl.
CPC ............ *G11C 16/10* (2013.01); *G06F 3/0604* (2013.01); *G06F 3/0619* (2013.01);
(Continued)

(58) Field of Classification Search
CPC .... G06F 3/0604; G06F 3/0619; G06F 3/0644; G06F 3/0647; G06F 3/0659;
(Continued)

(56) References Cited

U.S. PATENT DOCUMENTS 7,345,928 B2 3/2008 Li
8,139,406 B2 3/2012 Park et al.
(Continued)

FOREIGN PATENT DOCUMENTS

KR 10-2026177 B1 9/2019

OTHER PUBLICATIONS

European Extended Search Report dated May 10, 2021 for corresponding EP Patent Application No. 20209855.4.

*Primary Examiner* — Samir W Rizk
(74) *Attorney, Agent, or Firm* — Muir Patent Law, PLLC

(57) ABSTRACT

An operating method of a memory system includes preprogramming multi-page data of a memory controller to a nonvolatile memory device, generating a state group code based on multi-bit data of the multi-page data, and each state group data of the state group code having less number of bits than corresponding multi-bit data, detecting sudden power-off occurring after the preprogramming, backing up, in response to the detecting of the sudden power-off occurring, the state group code to the nonvolatile memory device, recovering, after power is recovered from the sudden power-off, the multi-page data from the nonvolatile memory device, based on the state group code, reprogramming the multi-page data to the nonvolatile memory device, and reprogramming, in response to the detecting of the sudden power-off not occurring, the multi-page data of the memory controller to the nonvolatile memory device.

20 Claims, 22 Drawing Sheets

(51) Int. Cl.
  *G06F 11/30* (2006.01)
  *G08C 25/00* (2006.01)
  *H03M 13/00* (2006.01)
  *G11C 16/10* (2006.01)
  *G06F 3/06* (2006.01)
  *G06F 11/10* (2006.01)
  *G11C 11/56* (2006.01)
  *G11C 16/08* (2006.01)
  *G11C 16/26* (2006.01)
  *G11C 16/34* (2006.01)
  *G11C 16/04* (2006.01)

(52) U.S. Cl.
  CPC .......... *G06F 3/0644* (2013.01); *G06F 3/0647* (2013.01); *G06F 3/0659* (2013.01); *G06F 3/0679* (2013.01); *G06F 11/1068* (2013.01); *G11C 11/56* (2013.01); *G11C 16/08* (2013.01); *G11C 16/26* (2013.01); *G11C 16/3459* (2013.01); *G11C 16/0483* (2013.01)

(58) Field of Classification Search
  CPC ....... G06F 3/0679; G11C 16/10; G11C 16/08; G11C 16/26; G11C 16/3429; G11C 16/0483
  See application file for complete search history.

(56) References Cited

U.S. PATENT DOCUMENTS

| | | |
|---|---|---|
| 8,391,062 B2 | 3/2013 | Jang |
| 8,681,543 B2 | 3/2014 | Jang |
| 9,218,851 B2 | 12/2015 | Shlick et al. |
| 9,349,442 B2 | 5/2016 | Shibata |
| 9,542,118 B1 | 1/2017 | Lercari et al. |
| 10,073,634 B2 | 9/2018 | Ojalvo et al. |
| 10,089,027 B2 | 10/2018 | Hashimoto et al. |
| 10,304,548 B2 | 5/2019 | Hong |
| 10,459,794 B2 | 10/2019 | Baek et al. |
| 10,552,058 B1 | 2/2020 | Jadon et al. |
| 11,175,984 B1 | 11/2021 | Lercari et al. |
| 11,309,032 B2 * | 4/2022 | Jang ............... G06F 3/0604 |
| 2008/0094893 A1 | 4/2008 | Choi |
| 2008/0266948 A1 | 10/2008 | Jang et al. |
| 2009/0185421 A1 | 7/2009 | Yun et al. |
| 2013/0155769 A1 * | 6/2013 | Li ............... G11C 16/0483 |
| | | 365/185.03 |
| 2013/0311710 A1 | 11/2013 | Yang |
| 2015/0301941 A1 | 10/2015 | Jun et al. |
| 2020/0202947 A1 | 6/2020 | Kim et al. |

\* cited by examiner

FIG. 15

<Normal Read Mode> NRVT

| PAGE | FIRST VOLTAGE | SECOND VOLTAGE | THIRD VOLTAGE | FOURTH VOLTAGE |
|---|---|---|---|---|
| FIRST PAGE | V1n | V4n | V6n | V11n |
| SECOND PAGE | V3n | V7n | V9n | V13n |
| THIRD PAGE | V2n | V8n | V14n | – |
| FOURTH PAGE | V5n | V10n | V12n | V15n |

FIG. 16

<Recovery Read Mode> RRVT

| PAGE | STATE GROUP | FIRST VOLTAGE | SECOND VOLTAGE | THIRD VOLTAGE | FOURTH VOLTAGE |
|---|---|---|---|---|---|
| FIRST PAGE | Group1 | V1 | V3 | V5 | V11 |
| | Group2 | – | V4 | V6 | V10 |
| SECOND PAGE | Group1 | V3 | V7 | V9 | V13 |
| | Group2 | V2 | V6 | V8 | V12 |
| THIRD PAGE | Group1 | V1 | V7 | V13 | – |
| | Group2 | V2 | V8 | V14 | – |
| FOURTH PAGE | Group1 | V5 | V9 | V11 | – |
| | Group2 | V4 | V10 | V12 | V14 |

OPERATING METHOD OF MEMORY SYSTEM INCLUDING MEMORY CONTROLLER AND NONVOLATILE MEMORY DEVICE

CROSS-REFERENCE TO RELATED APPLICATIONS

This application is a continuation of U.S. application Ser. No. 17/077,200 filed on Oct. 22, 2020 which claims the benefit of Korean Patent Application Nos. 10-2019-0153551, filed on Nov. 26, 2019 and 10-2020-0068602, filed on Jun. 5, 2020, in the Korean Intellectual Property Office, the disclosures of each of which are incorporated by reference herein in their entirety.

BACKGROUND

The inventive concept relates to a semiconductor device, and more particularly, to an operating method of a memory system for efficiently completing a program operation when sudden power-off (SPO) occurs while data is being programmed to a nonvolatile memory device.

Flash memory devices as examples of nonvolatile memory devices include memory cells having different threshold voltages according to programmed states. In a single-level cell (SLC) mode, a memory cell may be programmed to have a threshold voltage corresponding to one of an erased state and a programmed state. In a multi-level cell (MLC) mode, a memory cell may be programmed to have a threshold voltage corresponding to an erased state and one of a plurality of programmed states.

When SPO occurs in a nonvolatile memory device, data backup may be desirable for memory cells undergoing a program operation. The amount of data to be backed up for memory cells programmed in the MLC mode is greater than the amount of data to be backed up for memory cells programmed in the SLC mode, and accordingly, the required capacity of auxiliary power supply used for data backup increases.

SUMMARY

According to an exemplary embodiment of the present invention, an operating method of a memory system including a memory controller and a nonvolatile memory device includes preprogramming multi-page data of the memory controller to a plurality of memory cells connected to a word line of the nonvolatile memory device, wherein the multi-page data includes a plurality of multi-bit data, wherein each of the plurality of memory cells is preprogrammed to have a threshold voltage according to a corresponding one of the plurality of multi-bit data, and wherein the threshold voltage corresponds to one of a plurality of preprogrammed states, generating a state group code based on the plurality of multi-bit data of the multi-page data, wherein the state group code includes a plurality of state group data, and wherein each of the plurality of state group data has less number of bits than a corresponding one of the plurality of multi-bit data of the multi-page data, backing up the state group code to the nonvolatile memory device, recovering, after power is recovered from the sudden power-off, the multi-page data by reading the plurality of memory cells, which are preprogrammed, based on the state group code, reprogramming the multi-page data, recovered from the plurality of memory cells which are preprogrammed, to the plurality of memory cells which are preprogrammed, and reprogramming the multi-page data of the memory controller to the plurality of memory cells which are preprogrammed.

According to an exemplary embodiment of the present invention, an operating method of a memory system including a memory controller and a nonvolatile memory device includes preprogramming multi-page data of the memory controller to a plurality of memory cells connected to a word line of the nonvolatile memory device, wherein the multi-page data includes a plurality of multi-bit data, wherein each of the plurality of memory cells is preprogrammed to have a threshold voltage according to a corresponding one of the plurality of multi-bit data, and wherein the threshold voltage corresponds to one of a plurality of preprogrammed states, generating a state group code based on the plurality of multi-bit data of the multi-page data, wherein the state group code includes a plurality of state group data, and wherein each of the plurality of state group data has less number of bits than a corresponding one of the plurality of multi-bit data of the multi-page data, backing up the state group code to the nonvolatile memory device, detecting sudden power-off after the backing up of the state group code, recovering, after power is recovered from the sudden power-off occurred after the state group code is backed up, the multi-page data by reading the plurality of memory cells, which are preprogrammed, based on the state group code, reprogramming the multi-page data, recovered from the plurality of memory cells which are preprogrammed, to the plurality of memory cells, and reprogramming the multi-page data of the memory controller to the plurality of memory cells which are preprogrammed.

According to an exemplary embodiment of the present invention, an operating method of a memory system including a memory controller and a nonvolatile memory device, the nonvolatile memory device including a memory cell region including a first metal pad, and a peripheral circuit region including a second metal pad and vertically connected to the memory cell region by the first metal pad and the second metal pad, the operating method includes preprogramming multi-page data of the memory controller to a plurality of memory cells connected to a first word line of the nonvolatile memory device, wherein the multi-page data includes a plurality of multi-bit data, wherein each of the plurality of memory cells is preprogrammed to have a threshold voltage according to a corresponding one of the plurality of multi-bit data, and wherein the threshold voltage corresponds to one of a plurality of preprogrammed states, generating a state group code based on the plurality of multi-bit data of the multi-page data, wherein the state group code includes a plurality of state group data, and wherein each of the plurality of state group data has less number of bits than a corresponding one of the plurality of multi-bit data of the multi-page data, backing up the state group code to the nonvolatile memory device when sudden power-off occurs after the memory cells are preprogrammed, recovering, after power is recovered from the sudden power-off, the multi-page data by reading the plurality of memory cells, which are preprogrammed, based on the state group code, reprogramming the multi-page data, recovered from the plurality of memory cells which are preprogrammed, to the plurality of memory cells which are preprogrammed, and reprogramming the multi-page data of the memory controller to the plurality of memory cells which are preprogrammed when the sudden power-off does not occur after the memory cells are preprogrammed.

According to an exemplary embodiment of the present invention, an operating method of a memory system including a memory controller and a nonvolatile memory device includes preprogramming multi-page data of the memory controller to a plurality of first memory cells connected to a first word line of the nonvolatile memory device, wherein the multi-page data includes a plurality of multi-bit data, wherein each of the plurality of first memory cells is preprogrammed to have a threshold voltage according to a corresponding one of the plurality of multi-bit data, and wherein the threshold voltage corresponds to one of a plurality of preprogrammed states, generating a state group code based on the plurality of multi-bit data of the multi-page data, wherein the state group code includes a plurality of state group data, and wherein each of the plurality of state group data has less number of bits than a corresponding one of the plurality of multi-bit data of the multi-page data backing up the state group code to the nonvolatile memory device, recovering, after power is recovered from the sudden power-off, the multi-page data by reading the plurality of first memory cells, which are preprogrammed, based on the state group code, preprogramming the multi-page data, recovered from the plurality of first memory cells which are preprogrammed, to a plurality of second memory cells connected to a second word line of the nonvolatile memory device, reprogramming the multi-page data, recovered from the plurality of first memory cells which are preprogrammed, to the plurality of second memory cells which are preprogrammed, and reprogramming the multi-page data of the memory controller to the plurality of first memory cells which are preprogrammed.

According to an exemplary embodiment of the present invention, an operating method of a memory system including a memory controller and a nonvolatile memory device includes performing a first preprogram operation to preprogram multi-page data of the memory controller to a plurality of memory cells connected to a word line of the nonvolatile memory device, wherein the multi-page data includes a plurality of multi-bit data, wherein each of the plurality of memory cells is preprogrammed to have a threshold voltage according to a corresponding one of the plurality of multi-bit data, and wherein the threshold voltage corresponds to one of a plurality of preprogrammed states, generating a first state group code based on the plurality of multi-bit data of the multi-page data, wherein the first state group code includes a plurality of first state group data, and wherein each of the plurality of first state group data has less number of bits than a corresponding one of the plurality of multi-bit data of the multi-page data backing up the first state group code to the nonvolatile memory device, recovering, after power is recovered from the first sudden power-off, the multi-page data by reading the plurality of memory cells that are preprogrammed by the first preprogram operation, performing a second preprogram operation, based on the multi-page data recovered from the plurality of memory cells that are preprogrammed by the first preprogram operation, to the plurality of memory cells that are preprogrammed by the first preprogram operation, generating a second state group code based on a plurality of second multi-bit data of the multi-page data, wherein the second state group code includes a plurality of second state group data, and wherein each of the plurality of second state group data has less number of bits than a corresponding one of the plurality of multi-bit data of the multi-page data backing up the second state group code to the nonvolatile memory device, recovering, after power is recovered from the second sudden power-off, the multi-page data by reading the plurality of memory cells that are preprogrammed by the second preprogram operation; and reprogramming the multi-page data recovered from the memory cells that are preprogrammed by the second preprogram operation, to the plurality of memory cells that are preprogrammed by the second preprogram operation.

BRIEF DESCRIPTION OF THE DRAWINGS

Embodiments of the inventive concept will be more clearly understood from the following detailed description taken in conjunction with the accompanying drawings in which:

FIG. 15 is a table showing examples of read voltages in the normal read mode, according to an embodiment;

FIG. 16 is a table showing examples of read voltages in the recovery read mode, according to an embodiment;

DETAILED DESCRIPTION OF THE EMBODIMENTS

Embodiments will be clearly described in detail hereinafter so as to be easily implemented by one of ordinary skill in the art of the inventive concept.

Figure 1:
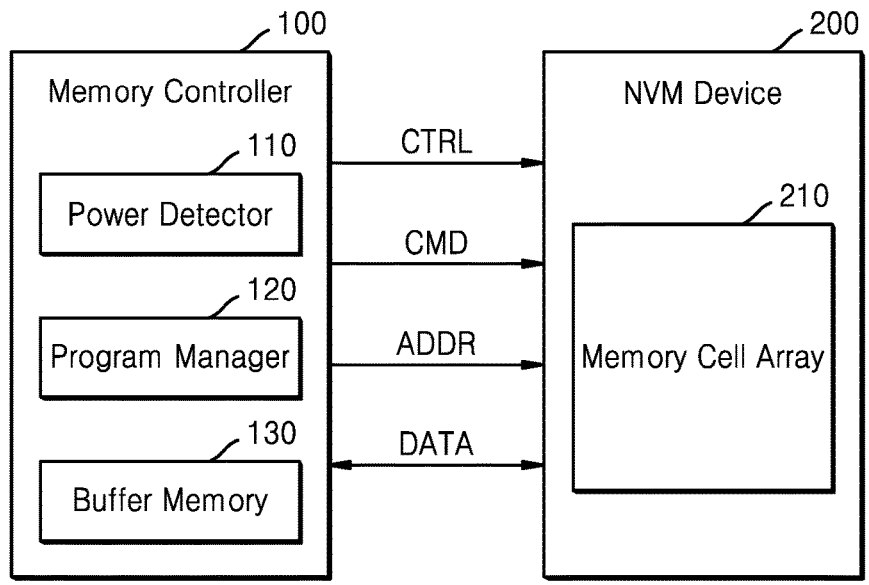
FIG. 1 is a block diagram of a memory system according to an embodiment.

FIG. 1 is a block diagram of a memory system according to an embodiment. Referring to FIG. 1, a memory system 10 may include a memory controller 100 and a nonvolatile memory (NVM) device 200. For example, the memory system 10 may be implemented as a storage device such as a solid state drive (SSD).

The memory controller 100 may control operations of the NVM device 200. The memory controller 100 may provide a control signal CTRL, a command CMD, and/or an address ADDR to the NVM device 200 to control the NVM device 200. In an example embodiment, the memory controller 100 may control the NVM device 200 to program data DATA thereto or read the data DATA therefrom in response to a request from an external host device.

In an example embodiment, the command CMD and the address ADDR may be transmitted from the memory controller 100 to the NVM device 200 using the same input/output channel as the data DATA. Alternatively, the command CMD and the address ADDR may be transmitted from the memory controller 100 to the NVM device 200 using a first input/output channel, and the data DATA may be transmitted from the memory controller 100 to the NVM device 200 using a second input/output channel.

The memory controller 100 may include a power detector 110, a program manager 120, and a buffer memory 130. The power detector 110 may detect a power state of the memory controller 100. For example, the power detector 110 may detect sudden power-off (SPO), which occurs unexpectedly, and a power recovery from the SPO, based on a voltage provided to the memory controller 100. The power detector 110 may determine the occurrence of SPO when the voltage provided to the memory controller 100 is less than a reference voltage. The power detector 110 may determine a power recovery when the voltage provided to the memory controller 100 is greater than the reference voltage.

The program manager 120 may manage a program operation of the NVM device 200. The program manager 120 may provide the control signal CTRL, the command CMD, the address ADDR, and/or the data DATA to the NVM device 200 according to a schedule predetermined for a program operation. In an example embodiment, when SPO occurs during a program operation, the program manager 120 may provide the control signal CTRL, the command CMD, the address ADDR, and/or the data DATA to the NVM device 200 according to the predetermined schedule so that the program operation is normally completed.

The buffer memory 130 may temporarily store data. In an example embodiment, the buffer memory 130 may temporarily store the data DATA to be provided to the NVM device 200 in a program operation or may temporarily store the data DATA provided from the NVM device 200 in a read operation.

The NVM device 200 may operate under the control of the memory controller 100. In an example embodiment, the NVM device 200 may output the data DATA stored therein or may store the data DATA provided from the memory controller 100, under the control of the memory controller 100.

The NVM device 200 may include a memory cell array 210. The memory cell array 210 may include a plurality of memory cells. For example, the memory cells may include flash memory cells. However, embodiments are not limited thereto, and the memory cells may include a resistive random access memory (RRAM) cell, a ferroelectric RAM (FRAM) cell, a phase-change RAM (PRAM) cell, a thyristor RAM (TRAM) cell, and a magnetic RAM (MRAM) cell.

Hereinafter, descriptions will be focused on embodiments in which the memory cells include NAND flash memory cells.

In an example embodiment, each of the memory cells of the memory cell array 210 may store N-bit data, where N is a positive integer. When N is at least 2, the memory cell may be referred to as a multi-level cell (MLC), and N-bit data may be referred to as multi-bit data. For example, when N is 3, the memory cell may be referred to as a triple-level cell (TLC). For example, when N is 4, the memory cell may be referred to as a quadruple-level cell (QLC). However, when N is at least 2, N-bit data will be referred to as "multi-bit data" hereafter.

According to embodiments, when SPO occurs during a program operation on multi-bit data, the memory system 10 may back up less amount of data than the multi-bit data and recover the multi-bit data based on the backed-up data after a power recovery. Accordingly, auxiliary power and memory capacity required for such data backup may be reduced. Hereinafter, embodiments for efficiently completing a program operation on multi-bit data when SPO occurs during the program operation will be described in detail.

Figure 2:
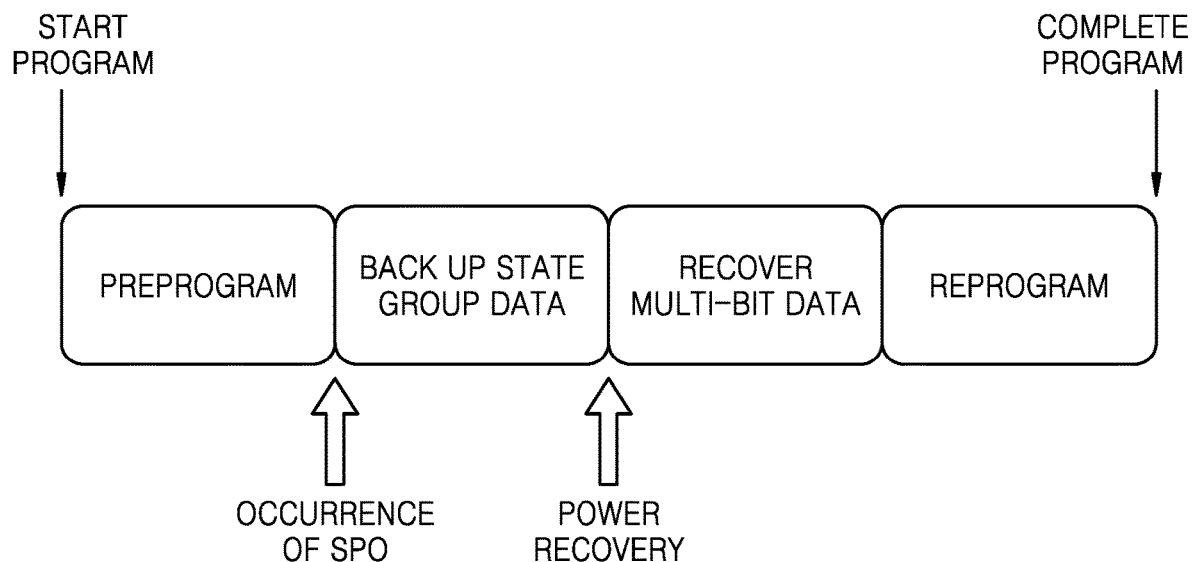
FIG. 2 is a diagram of an example program operation of the memory system of FIG. 1 in a state where sudden power-off (SPO) occurs.
Figure 3:
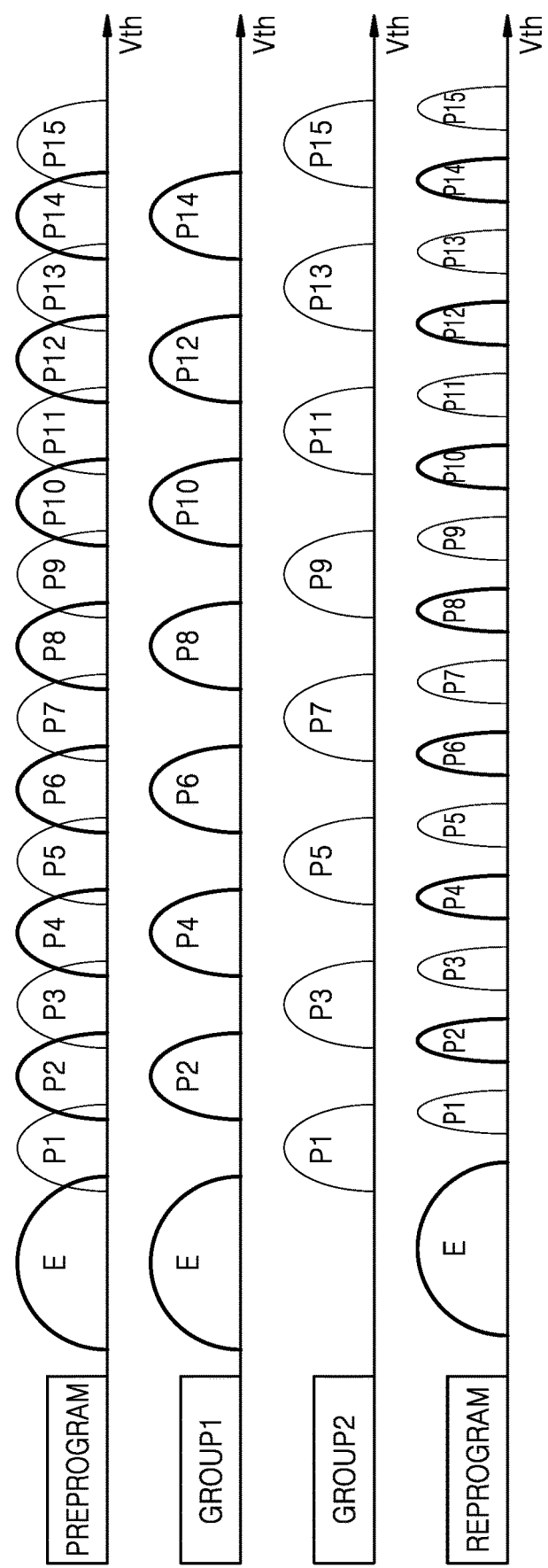
FIG. 3 illustrates graphs showing threshold voltage distributions of a nonvolatile memory device, according to an embodiment.

FIG. 2 is a diagram of an example program operation of the memory system 10 of FIG. 1 in a state where an SPO occurs. FIG. 3 illustrates graphs showing threshold voltage distributions of an NVM memory device, according to an embodiment.

Referring to FIGS. 2 and 3, when programming starts, the memory system 10 may preprogram (or coarse-program) multi-bit data to a memory cell of the NVM device 200. For example, when the multi-bit data is 4-bit data, a preprogrammed memory cell may have a threshold voltage corresponding to one threshold voltage distribution (i.e., one preprogrammed state) among 16 threshold voltage distributions (i.e., 16 states), e.g., an erased state E and first through fifteenth programmed states P1 through P15, as shown in FIG. 3. The 16 threshold voltage distributions may respectively correspond to 16 values that the multi-bit data may have. The preprogrammed memory cell may correspond to one of the 16 threshold voltage distributions according to a multi-bit data value. In the preprogramming, threshold voltages of adjacent memory cells may change due to capacitive coupling between the adjacent memory cells, and accordingly, the width of each threshold voltage distribution may increase. As a result, adjacent threshold voltage distributions may overlap each other. After the preprogramming of the multi-bit data on a memory cell, the preprogrammed memory cell may have a threshold voltage within a corresponding one of sixteen threshold voltage distributions (i.e., sixteen preprogrammed states) and two adjacent threshold voltage distributions (i.e., two adjacent preprogrammed states) may overlap each other. The threshold voltage of the preprogrammed state may fall into the overlapped region between two adjacent threshold voltage distributions.

The threshold voltage distributions of preprogrammed memory cells may be classified into a plurality of state groups. For example, as shown in FIG. 3, threshold voltage distributions respectively corresponding to the erased state E and the first through fifteenth programmed states P1 through P15 may be classified into a first state group GROUP1 and a second state group GROUP2. In an example embodiment, the state groups may include different threshold voltage distributions from each other, and the threshold voltage distributions of each of the state groups do not overlap each other. For example, the first state group GROUP1 may include threshold voltage distributions respectively corresponding to the erased state E, the second programmed state P2, the fourth programmed state P4, the sixth programmed state P6, the eighth programmed state P8, the tenth programmed state P10, the twelfth programmed state P12, and the fourteenth programmed state P14, and the second state group GROUP2 may include threshold voltage distributions respectively corresponding to the first programmed state P1, the third programmed state P3, the fifth programmed state P5, the seventh programmed state P7, the ninth programmed state P9, the eleventh programmed state P11, the thirteenth programmed state P13, and the fifteenth programmed state P15. In an example embodiment, each of the erased state E and the programmed states P1 to P15 may be mapped to a gray code and may represent 4 bits of the multi-bit data. In the gray code mapping, a programmed state (or a preprogrammed state) having "1" bit in an odd number and a programmed state (or a preprogrammed state) having "1" bit in an even number may be alternately arranged among the erased state E and the first to fifteenth programmed states (or preprogrammed states) P1 to P15. The programmed states (or preprogrammed states) using the gray code mapping will be described later with reference to FIG. 14.

Each of the state groups may be represented with state group data (i.e., state group identifier). For example, the first state group GROUP1 and the second state group GROUP2 may be represented by 1-bit state group data. For example, state group data representing the first state group GROUP1 may be expressed as "0", and state group data representing the second state group GROUP2 may be expressed as "1". However, embodiments are not limited thereto, and the number of bits in state group data may vary with the number of state groups. For example, when threshold voltage distributions are classified into four state groups, state group data may be 2-bit data. In this case, the number of bits in state group data may be less than the number of bits in multi-bit data, and when the multi-bit data includes N bits, the state group data may include (N−1) bits.

Preprogrammed multi-bit data may correspond to state group data representing one of a plurality of state groups according to a data value of the preprogrammed multi-bit data. For example, as shown in FIG. 3, multi-bit data corresponding to the erased state E may correspond to state group data representing the first state group GROUP1, and multi-bit data corresponding to the first programmed state P1 may correspond to state group data representing the second state group GROUP2.

When SPO occurs after a preprogram operation is completed, the memory system 10 may back up state group data corresponding to a preprogrammed memory cell to the NVM device 200. For example, as shown in FIG. 3, when multi-bit data corresponding to the first programmed state P1 is preprogrammed, the memory system 10 may back up state group data, which represents the second state group GROUP2, to the NVM device 200 in correspondence to a preprogrammed memory cell.

When power is recovered from SPO, the memory system 10 may recover multi-bit data based on backed-up state group data. For example, the memory system 10 may read the multi-bit data from a preprogrammed memory cell based on the state group data. As shown in FIG. 3, even though there is an overlapping region between threshold voltage distributions of preprogrammed memory cells, a threshold voltage distribution including the overlapping region may be identified when a read operation is performed with respect to each state group based on the state group data. Accordingly, the reliability of recovered multi-bit data may increase.

The memory system 10 may reprogram (or fine-program) multi-bit data to a memory cell based on the recovered multi-bit data. A program operation on the multi-bit data may be completed by the reprogram operation. As shown in FIG. 3, due to the reprogram operation, the width of a threshold voltage distribution of memory cells may be decreased. Because an increase in a threshold voltage of a memory cell via the reprogram operation is less than an increase in the threshold voltage via the preprogram operation, a threshold voltage distribution involved in the reprogram operation may be less affected by coupling. Accordingly, after the reprogram operation, memory cells may have narrower threshold voltage distributions compared to after the preprogram operation, and an overlapping region between threshold voltage distributions may be reduced. Accordingly, when multi-bit data is read from a reprogrammed memory cell, the reliability of the multi-bit data may be increased.

In an example embodiment, a reprogram verify voltage for reprogramming multi-bit data may be higher than a preprogram verify voltage for preprogramming multi-bit data. For example, a preprogram operation may be performed using a preprogram verify voltage corresponding to a threshold voltage lower than a desired threshold voltage, and a memory cell may be programmed to the desired threshold voltage using a reprogram verify voltage higher than the preprogram verify voltage in a reprogram operation.

The memory system 10 may back up state group data after SPO occurs, as described above with reference to FIG. 2, but embodiments are not limited thereto. For example, the memory system 10 may back up state group data before SPO occurs.

As described above, in the case of SPO, the memory system 10 may back up state group data corresponding to multi-bit data and may complete a program operation on the multi-bit data based on the backed-up state group data. In this case, because the number of bits in the state group data is less than the number of bits in the multi-bit data, auxiliary power and memory capacity required for a backup operation may be decreased compared to an operation of directly backing up the multi-bit data.

Hereinafter, embodiments will be described focusing on an embodiment, in which multi-bit data is 4-bit data and state group data is 1-bit data, as shown in FIG. 3, but are not limited thereto.

Figure 4:
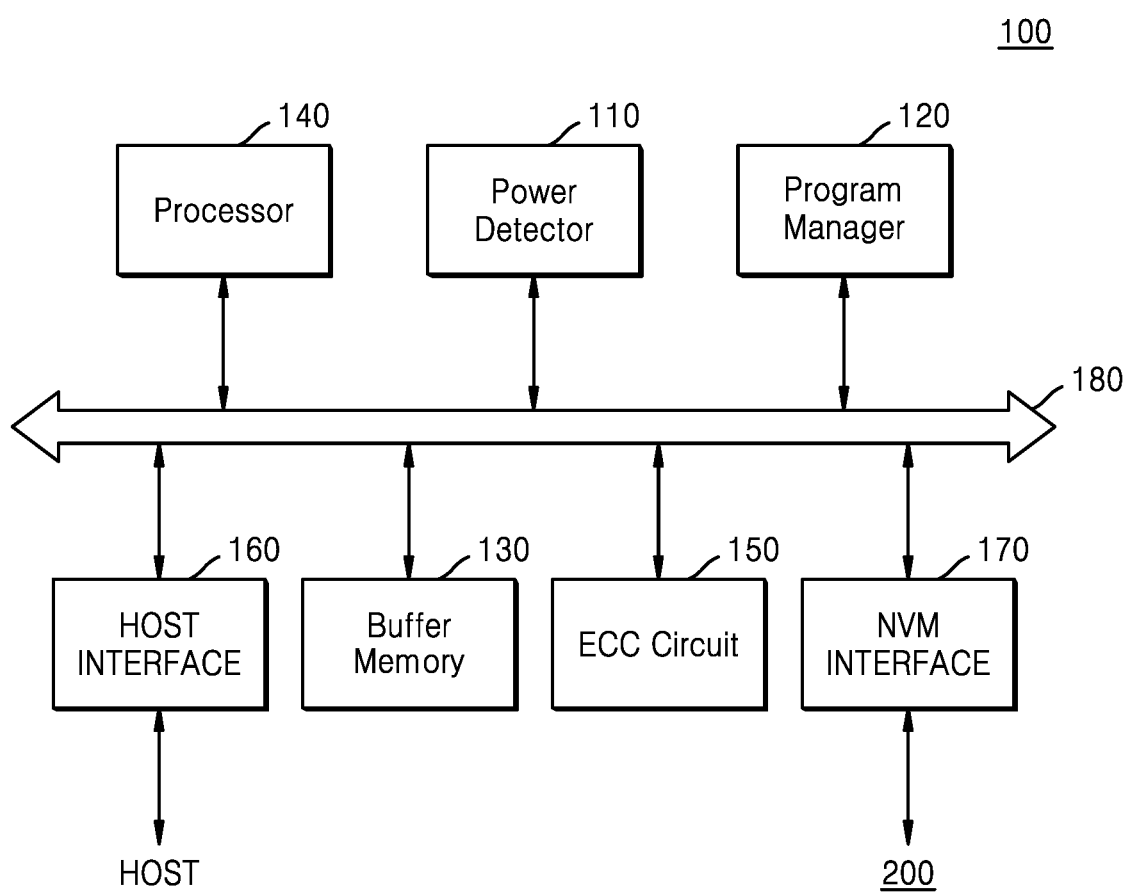
FIG. 4 is an example block diagram of a memory controller of FIG. 1.

FIG. 4 is an example block diagram of the memory controller 100 of FIG. 1. Referring to FIG. 4, the memory controller 100 may include the power detector 110, the program manager 120, the buffer memory 130, a processor 140, an error correction code (ECC) circuit 150, a host interface 160, an non-volatile memory (NVM) interface 170, and a bus 180. Hereinafter, redundant descriptions given with respect to FIG. 1 above will be omitted.

The power detector 110 may detect the occurrence of SPO or a power recovery from SPO by sensing a voltage provided to the memory controller 100. For example, the power detector 110 may include a voltage sensor.

The program manager 120 may manage a program operation on multi-bit data. For example, as described above with reference to FIG. 2, the program manager 120 may generate the control signal CTRL, the command CMD, and/or the address ADDR such that a program operation is performed on multi-bit data through preprogramming and reprogramming. When SPO is detected during a program operation on multi-bit data, the program manager 120 may generate the control signal CTRL, the command CMD, and/or the address ADDR according to a predetermined schedule so that the program operation on the multi-bit data is completed.

In an example embodiment, the program manager 120 may manage address information including first address information, to which multi-bit data is programmed, and second address information, to which state group data is backed up. The address information may be stored in the buffer memory 130 or a separate memory in the memory controller 100. When SPO occurs, the address information may be backed up to the NVM device 200 together with state group data.

In an example embodiment, the program manager 120 may be implemented by software or firmware such as a flash translation layer (FTL). In this case, the program manager 120 may be loaded to a memory (e.g., the buffer memory 130 or a separate memory) in the memory controller 100 and executed by the processor 140. However, embodiments are not limited thereto, and the program manager 120 may be implemented by hardware.

The buffer memory 130 may temporarily store data, which is provided from a host, generated in the memory controller 100, or provided from the NVM device 200. For example, the buffer memory 130 may temporarily store multi-bit data to be provided to the NVM device 200 during a program operation. When SPO occurs during the program operation, the multi-bit data stored in the buffer memory 130 may be lost. After power is recovered from SPO, multi-bit data read from the NVM device 200 may be temporarily stored in the buffer memory 130. For example, the buffer memory 130 may include dynamic RAM (DRAM) or static RAM (SRAM), but embodiments are not limited thereto.

The processor 140 may control all operations of the memory controller 100. For example, the processor 140 may drive the program manager 120. Accordingly, a program operation on multi-bit data may be performed.

The ECC circuit 150 may correct an error in data read from the NVM device 200. For example, when power is recovered from SPO, the ECC circuit 150 may correct an error in multi-bit data read from the NVM device 200. When reprogramming is performed based on the error-corrected multi-bit data, the reliability of multi-bit data programmed to the NVM device 200 may be increased.

The host interface 160 may provide a physical connection between a host and the memory controller 100. For example, the host interface 160 may include various interface methods such as an advanced technology attachment (ATA) interface, a serial ATA (SATA) interface, an external SATA (e-SATA) interface, a small computer small interface (SCSI) interface, a serial attached SCSI (SAS) interface, a peripheral component interconnection (PCI) interface, a PCI express (PCI-E) interface, Institute of Electrical and Electronics Engineers (IEEE) 1394, a universal serial bus (USB) interface, a secure digital (SD) card interface, a multi-media card (MMC) interface, an embedded MMC (eMMC) interface, and a compact flash (CF) card interface.

The NVM interface 170 may provide a physical connection between the memory controller 100 and the NVM device 200. For example, the control signal CTRL, the command CMD, the address ADDR, and the data DATA may be transferred between the memory controller 100 and the NVM device 200 through the NVM interface 170. The bus 180 may be configured to provide a channel between elements of the memory controller 100.

Figure 5:
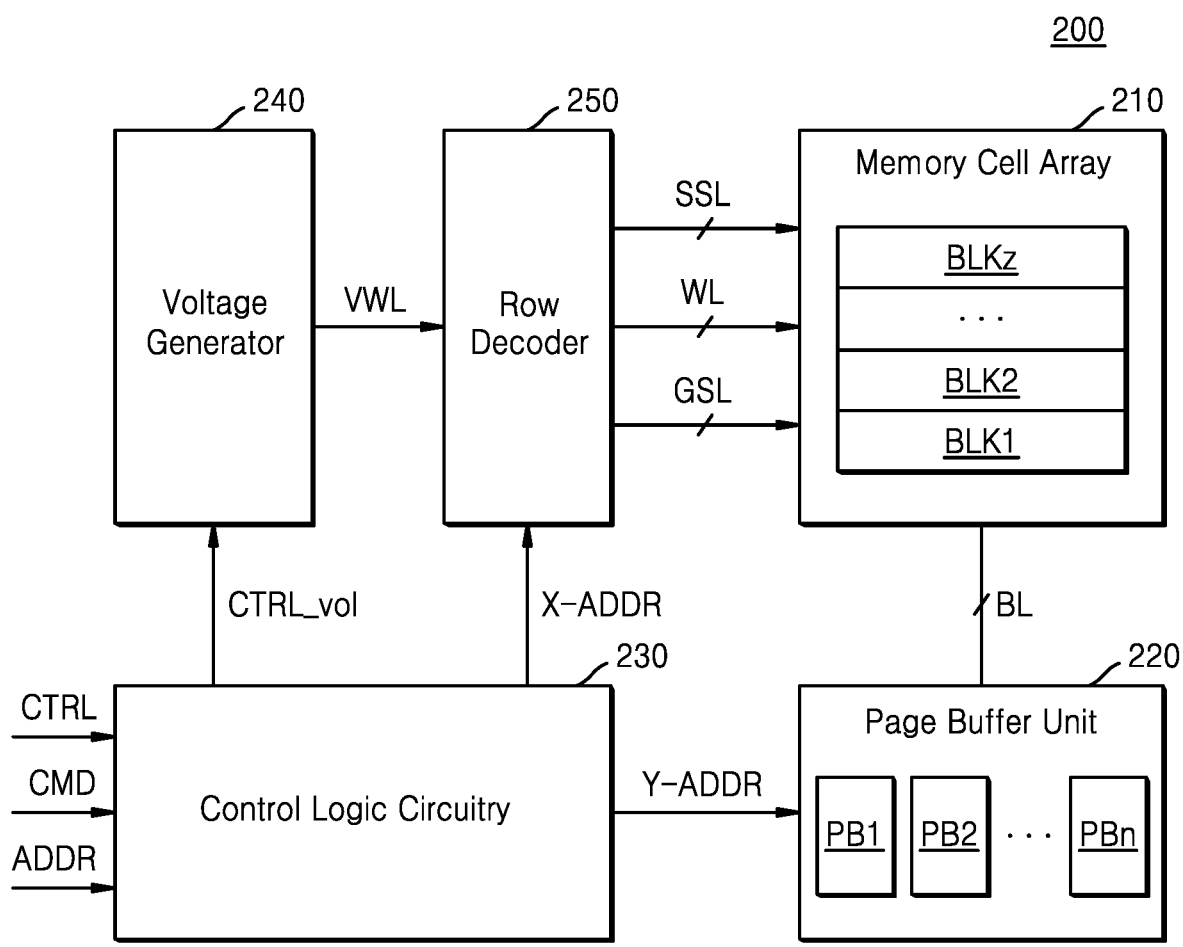
FIG. 5 is an example block diagram of a nonvolatile memory device of FIG. 1.

FIG. 5 is an example block diagram of the NVM device 200 of FIG. 1. Referring to FIG. 5, the NVM device 200 may include the memory cell array 210, a page buffer unit 220, control logic circuitry 230, a voltage generator 240, and a row decoder 250. Although not shown, the NVM device 200 may further include a data input/output circuit or an input/output interface. The NVM device 200 may further include a column logic, a pre-decoder, a temperature sensor, a command decoder, or an address decoder.

The memory cell array 210 may include a plurality of memory blocks BLK1 through BLKz (where "z" is a positive integer). Each of the memory blocks BLK1 through BLKz may include a plurality of memory cells. The memory blocks BLK1 through BLKz may be included in one memory plane, but embodiments are not limited thereto. In an example embodiment, the NVM device 200 may include two or more memory planes which are independently controlled. The memory cell array 210 may be connected to the page buffer unit 220 through bit lines BL and connected to the row decoder 250 through word lines WL, string selection lines SSL, and ground selection lines GSL.

In an example embodiment, the memory cell array 210 may include three-dimensional (3D) memory cell array, which may include a plurality of NAND strings. Each of the NAND strings may include memory cells respectively connected to word lines vertically stacked on a substrate. These will be described in detail with reference to FIG. 6 below. The disclosures of U.S. Pat. Nos. 7,679,133, 8,553,466, 8,654,587, 8,559,235, and U.S. Patent Application No. 2011/0233648 are incorporated herein by references. In an example embodiment, the memory cell array 210 may include a two-dimensional (2D) memory cell array, which may include a plurality of NAND strings in row and column directions.

The page buffer unit 220 may include a plurality of page buffers, e.g., first through n-th page buffers PB1 through PBn (where "n" is an integer of at least 3). The first through n-th page buffers PB1 through PBn may be respectively connected to memory cells through the bit lines BL. The page buffer unit 220 may select at least one of the bit lines BL in response to a column address Y-ADDR. The page buffer unit 220 may operate as a write driver or a sense amplifier according to an operating mode. For example, during a program operation, the page buffer unit 220 may apply a bit line voltage, which corresponds to data to be programmed, to a selected bit line. During a read operation, the page buffer unit 220 may sense data stored in a memory cell by sensing a current or a voltage of a selected bit line. Each of the first through n-th page buffers PB1 through PBn will be described in detail with reference to FIG. 13 below.

The control logic circuitry 230 may control various operations of the NVM device 200. The control logic circuitry 230 may output various control signals for programming data to the memory cell array 210, reading data from the memory cell array 210, or erasing data stored in the memory cell array 210, in response to the control signal CTRL, the command CMD, and/or the address ADDR. For example, the control logic circuitry 230 may output a voltage control signal CTRL_vol, a row address X-ADDR, and the column address Y-ADDR.

In an example embodiment, the control logic circuitry 230 may output control signals for programming multi-bit data according to the control signal CTRL, the command CMD, and/or the address ADDR. For example, the control logic circuitry 230 may output control signals for a preprogram operation and a reprogram operation, control signals for a backup of state group data, or control signals for reading preprogrammed multi-bit data.

The voltage generator 240 may generate various kinds of voltages for performing program, read, and erase operations based on the voltage control signal CTRL_vol. For example, the voltage generator 240 may generate a program voltage, a read voltage, and a program verify voltage as word line voltages VWL. For example, the program voltage may be generated using incremental step pulse programming (ISPP).

In a program operation on multi-bit data, the voltage generator 240 may generate a preprogram verify voltage for preprogramming and a reprogram verify voltage for reprogramming. In this case, the preprogram verify voltage may be less than the reprogram verify voltage.

The row decoder 250 may select one of the word lines WL and one of the string selection lines SSL in response to the row address X-ADDR. For example, the row decoder 250 may apply a program voltage and a program verify voltage to a selected word line during a program operation and may apply a read voltage to a selected word line during a read operation.

Figure 6:
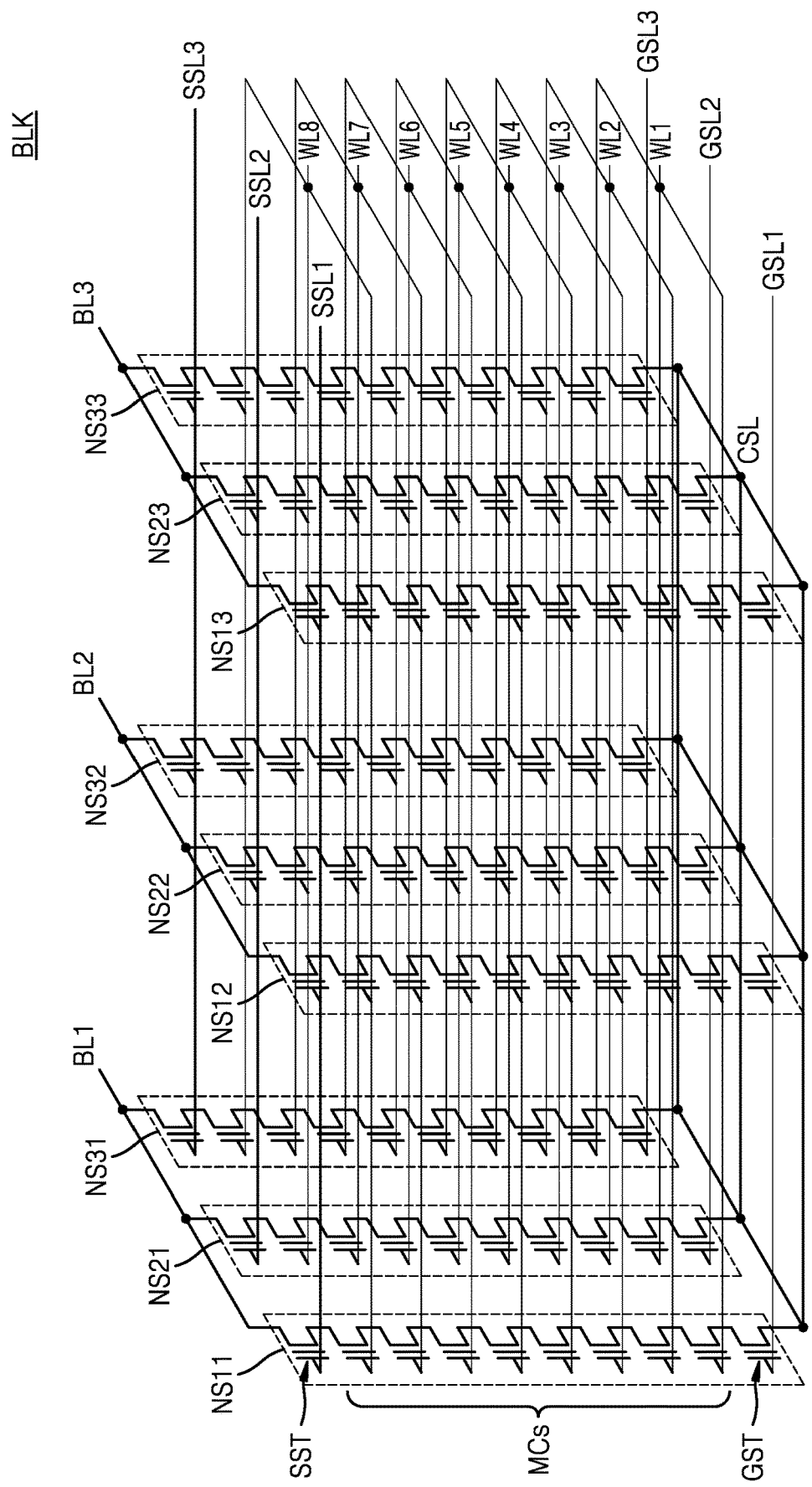
FIG. 6 is a circuit diagram illustrating a memory block according to an embodiment.

FIG. 6 is a circuit diagram illustrating a memory block according to an embodiment. Referring to FIG. 6, a memory block BLK may correspond to one of the memory blocks BLK1 through BLKz in FIG. 5. The memory block BLK may include NAND strings NS11 through NS33. Each string (e.g., NS11) may include a string selection transistor SST, a plurality of memory cells MCs, and a ground selection transistor GST, which are connected in series to one another.

The NAND strings NS11, NS21, and NS31 may be between a first bit line BL1 and a common source line CSL; the NAND strings NS12, NS22, and NS32 may be between a second bit line BL2 and the common source line CSL; and the NAND strings NS13, NS23, and NS33 may be between a third bit line BL3 and the common source line CSL. The string selection transistor SST may be connected to a corresponding one of string selection lines SSL1 through SSL3. The memory cells MCs may be respectively connected to corresponding word lines WL through WL8. The ground selection transistor GST may be connected to a corresponding one of ground selection lines GSL1 through GSL3. The string selection transistor SST may be connected to a corresponding one of the first through third bit lines BL1 through BL3, and the ground selection transistor GST may be connected to the common source line CSL. The numbers of NAND strings, word lines, bit lines, ground selection lines, and string selection lines may vary with embodiments.

Figure 7:
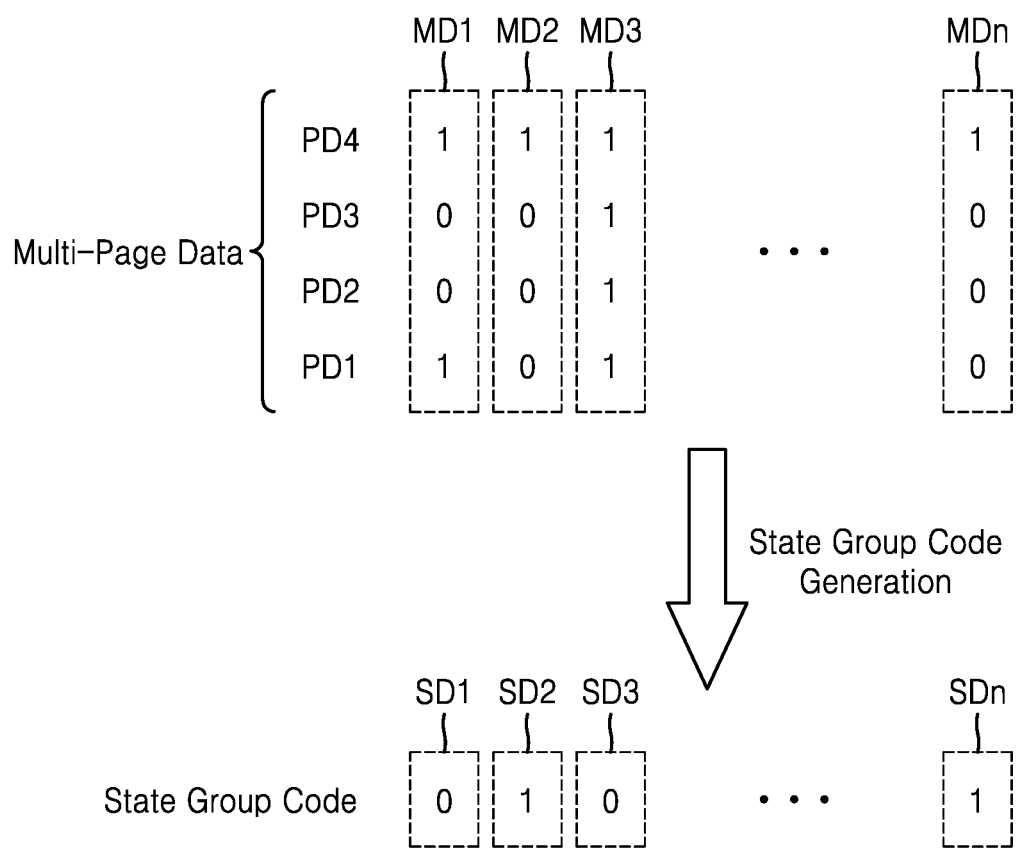
FIG. 7 shows an example of generating state group code, according to an embodiment.

FIG. 7 shows an example of generating a state group code, according to an embodiment. Referring to FIG. 7, multi-page data may include first through n-th multi-bit data MD1 through MDn to be programmed to "n" memory cells connected to one word line. For example, when multi-bit data is 4-bit data, multi-page data may include first through fourth page data PD1 through PD4. Each block may include a plurality of pages. Each page is the smallest unit for a programming operation or a read operation in an SLC mode. In a program operation of a QLC mode, 4-bit data of the multi-bit data corresponding to four pages may be stored in the page buffer unit 220 and then may be programmed to a desired threshold voltage among sixteen programmed states (i.e., sixteen threshold voltage distributions) via at least two programming operations including the preprogramming (i.e., coarse programming) and the reprogramming (i.e., fine programming).

The state group code may include first through n-th state group data SD1 through SDn generated based on the first through n-th multi-bit data MD1 through MDn. For example, state group data may be generated based on the number of "1" bits (or "0" bits) in multi-bit data. For example, state group data may be generated as 1 when there is an odd number of "1" bits and as 0 when there is an even number of "1" bits. For example, when 1-bit state group data is generated based on multi-bit data, the first state group data SD1 "0" may be generated based on the first multi-bit data MD1 "1001", and the second state group data SD2 "1" may be generated based on the second multi-bit data MD2 "1000". Consequently, the state group code may be generated from multi-page data.

The number of bits in state group code may be less than the number of bits in multi-page data. For example, when 1-bit state group data is generated from 4-bit multi data, the number of bits in state group code may be ¼ of the number of bits in multi-page data.

Hereinafter, the detailed operations of the memory system 10 of FIG. 1 will be described based on the basis of multi-page data and state group code.

Figure 8:
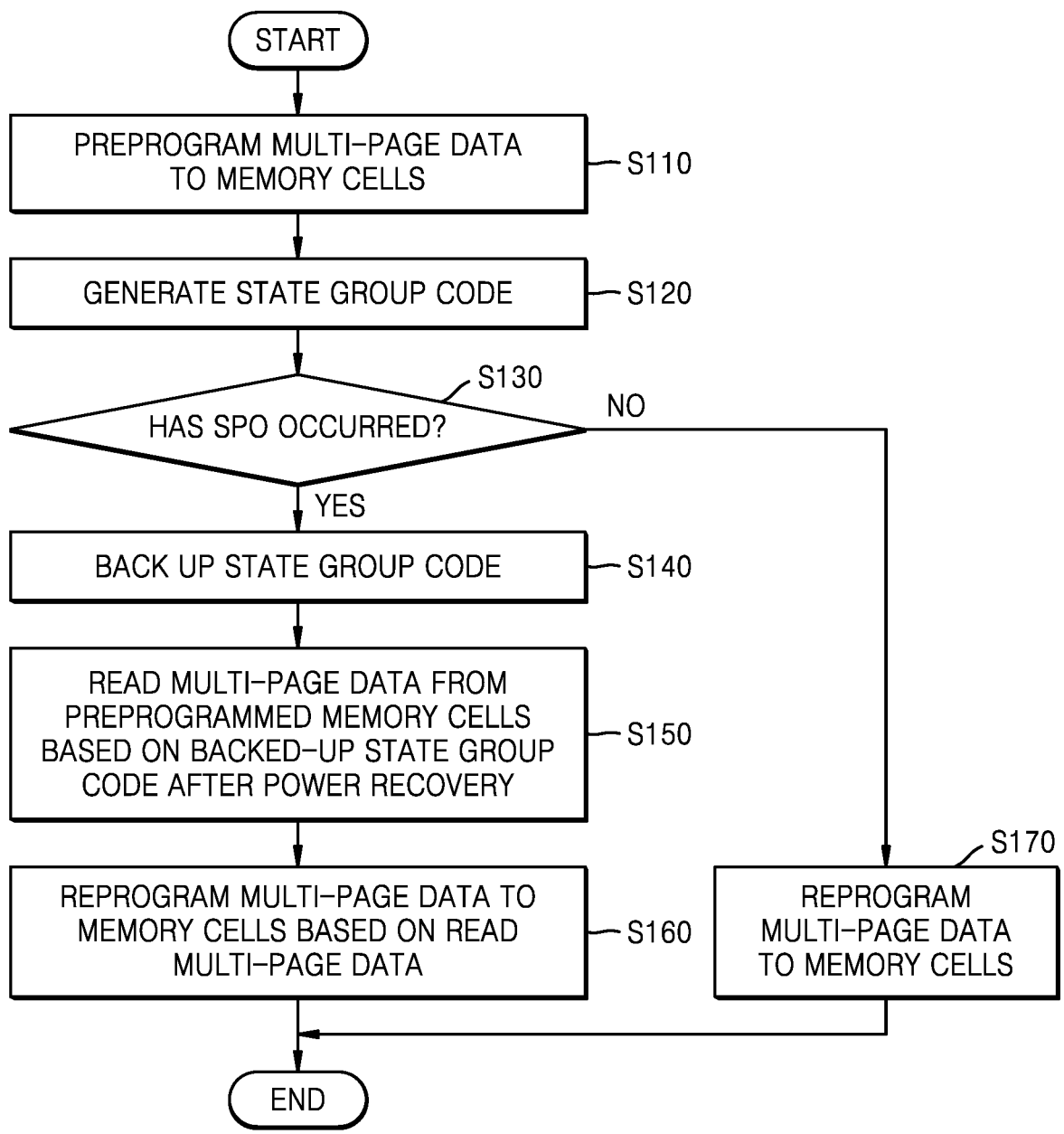
FIG. 8 is a flowchart of an operating method of the memory system of FIG. 1, according to an embodiment.

FIG. 8 is a flowchart of an operating method of the memory system 10 of FIG. 1, according to an embodiment. Referring to FIGS. 1 and 8, the memory system 10 may preprogram multi-page data to memory cells in operation S110. The memory system 10 may generate a state group code based on the multi-page data in operation S120. The state group code may be generated in the memory controller 100 or the NVM device 200. For example, the state group code may be generated by a logic operation on bits in multi-bit data.

The memory system 10 may determine whether SPO has occurred in operation S130. When SPO has occurred, the memory system 10 may back up the state group code to the NVM device 200 in operation S140. In this case, the state group code may be backed up to the same memory plane as the multi-page data has been preprogrammed, but embodiments are not limited thereto.

After a power recovery, the memory system 10 may read the multi-page data from the preprogrammed memory cells based on the backed-up state group code in operation S150. To perform a read operation based on the state group code, the NVM device 200 may read the multi-page data in a different manner than a normal read operation. For example, the NVM device 200 may read the multi-page data using a different read voltage level than that used in a normal read operation.

The memory system 10 may reprogram the multi-page data to memory cells based on the read multi-page data in operation S160. In this case, the reprogrammed memory cells may be the same as the preprogrammed memory cells.

When SPO does not occur after the preprogramming, the memory system 10 may reprogram the multi-page data to the memory cells without a backup of state group code in operation S170. When SPO does not occur, the multi-page data of the buffer memory 130 may be maintained, and therefore, the memory system 10 may reprogram multi-page data based on the multi-page data stored in the buffer memory 130 of the memory controller 100.

Although the embodiment in which a state group code is generated after multi-page data is preprogrammed has been described with reference to FIG. 8, embodiments are not limited thereto. For example, a state group code may be generated before or during a preprogram operation.

According to the embodiment of FIG. 8, the memory system 10 may back up a state group code instead of multi-page data when SPO occurs during a program operation. The memory system 10 may recover original multi-page data from preprogrammed memory cells based on the backed-up state group code without a backup of the original multi-page data. Accordingly, the size and capacity of an auxiliary power supply necessary for a data backup may be reduced, and therefore, the manufacturing cost and size of the memory system 10 may also be reduced.

Operating methods of the memory system 10 at the occurrence of SPO will be described in detail with reference to FIGS. 9 and 10 below.

Figure 9:
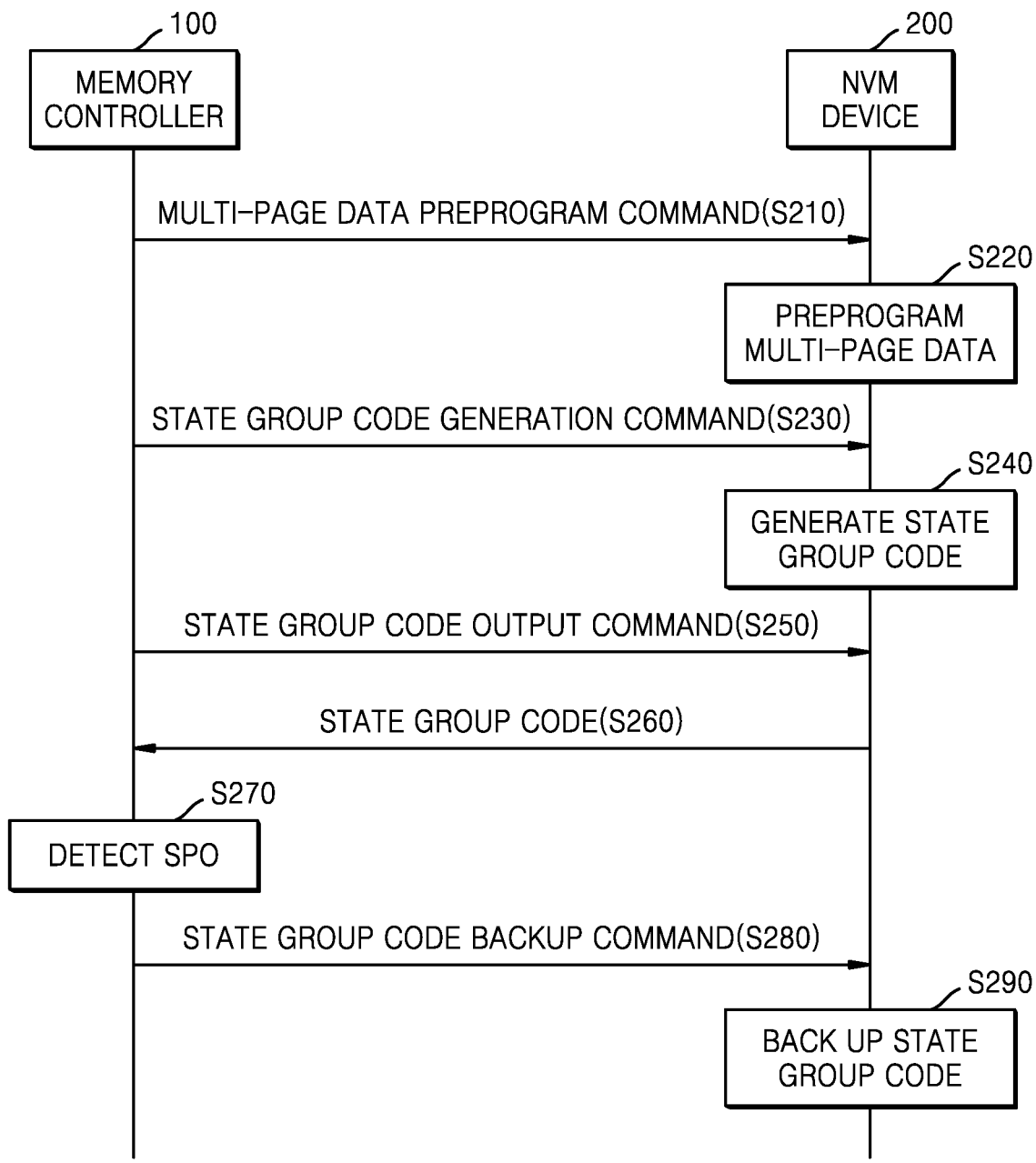
FIG. 9 is a flowchart of operations between a memory controller and a nonvolatile memory device when SPO occurs, according to an embodiment.

FIG. 9 is a flowchart of operations between a memory controller and an NVM device when SPO occurs, according to an embodiment. In detail, FIG. 9 shows an embodiment in which a state group code is generated by the NVM device 200.

Referring to FIG. 9, the memory controller 100 may transmit a preprogram command with respect to multi-page data to the NVM device 200 in operation S210. The memory controller 100 may also transmit multi-page data to the NVM device 200 together with the preprogram command. For example, when the multi-page data includes four pages, the memory controller 100 may transmit the command CMD and the address ADDR to the NVM device 200 such that the multi-page data is preprogrammed in a QLC mode.

The NVM device 200 may preprogram the multi-page data in response to the preprogram command in operation S220. For example, the NVM device 200 may preprogram the multi-page data to memory cells, which are indicated by the address ADDR, based on a preprogram verify voltage.

The memory controller 100 may transmit a state group code generation command to the NVM device 200 in operation S230. For example, the memory controller 100 may transmit the command CMD for generating state group code to the NVM device 200. The NVM device 200 may generate a state group code in response to the state group code generation command in operation S240. The NVM device 200 may generate the state group code based on the multi-page data.

In an example embodiment, the NVM device 200 may generate a state group data based on each piece of multi-bit data of the multi-page data loaded to the page buffer unit 220 in FIG. 5. For example, the NVM device 200 may generate a state group data through a logic operation on bits in multi-bit data. The generated state group data may be temporarily stored in the page buffer unit 220.

The memory controller 100 may transmit a state group code output command to the NVM device 200 in operation S250. The NVM device 200 may transmit the state group code to the memory controller 100 in response to the state group code output command in operation S260. For example, the NVM device 200 may output the state group code temporarily stored in the page buffer unit 220. The state group code provided from the NVM device 200 may be stored in the buffer memory 130 of the memory controller 100. According to an embodiment, operation S250 may be skipped. For example, in response to the state group code generation command, the NVM device 200 may generate and transmit state group code to the memory controller 100.

The memory controller 100 may detect SPO in operation S270. According to the detection of SPO, the memory controller 100 may transmit a state group code backup command to the NVM device 200 in operation S280. The memory controller 100 may transmit the state group code to the NVM device 200 together with the state group code backup command. For example, the memory controller 100 may transmit the command CMD and the address ADDR to the NVM device 200 such that the state group code is programmed in an SLC mode. In this case, the memory controller 100 may transmit another command CMD to the NVM device 200 to change the mode of the NVM device 200 into the SLC mode, but embodiments are not limited thereto.

The NVM device 200 may back up the state group code in response to the state group code backup command in operation S290. For example, the NVM device 200 may program the state group code to memory cells, which correspond to the address ADDR, in the SLC mode. However, embodiments are not limited thereto, and the NVM device 200 may program the state group code in an MLC mode in response to the command CMD from the memory controller 100.

Although the operating method of FIG. 9 includes operations S250 and S260, in which the state group code is output from the NVM device 200 by the command of the memory controller 100, operations S250 and S260 may be skipped. In this case, the state group code may be backed up to the NVM device 200 according to a copyback command of the memory controller 100.

Figure 10:
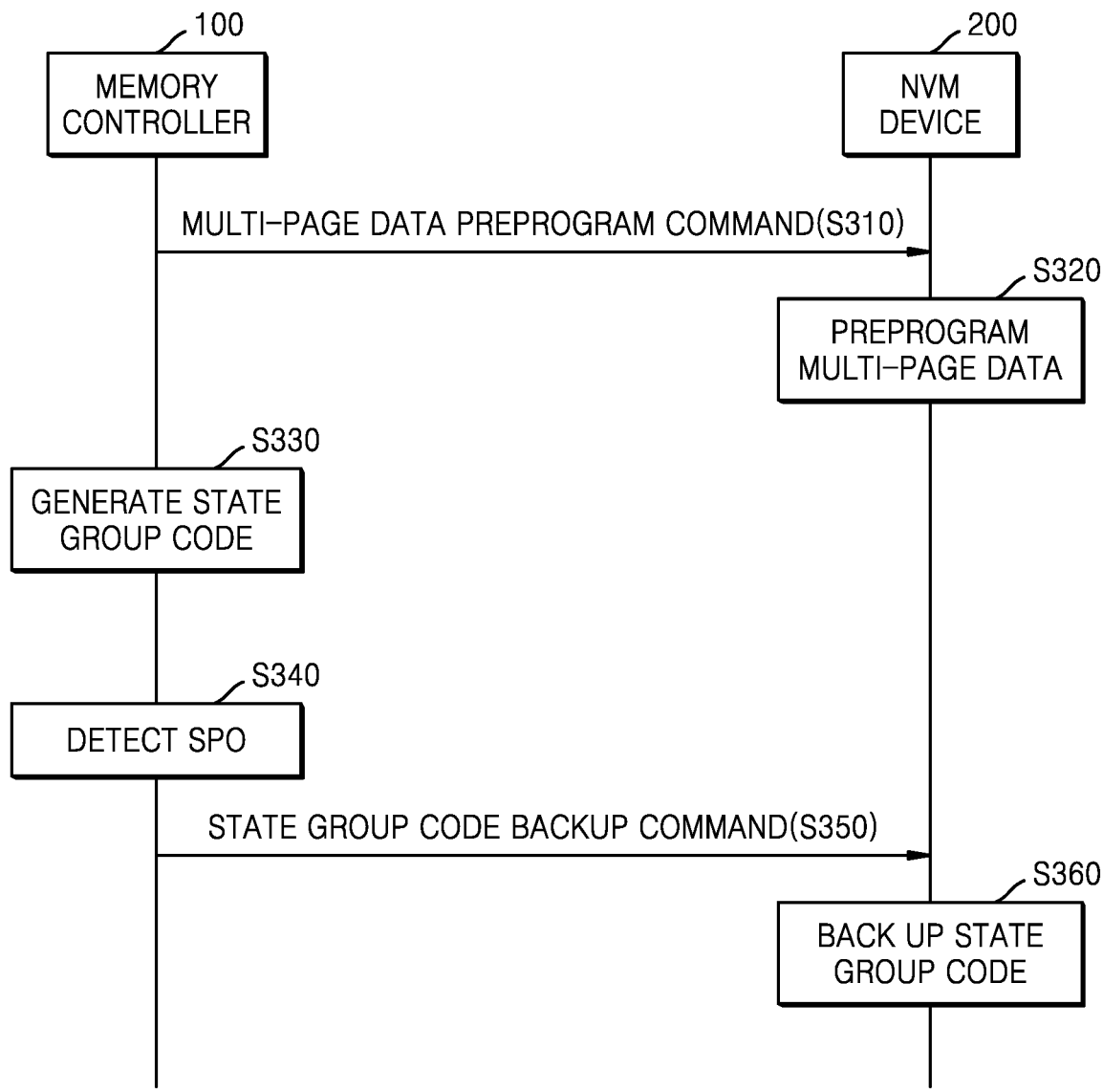
FIG. 10 is a flowchart of operations between a memory controller and a nonvolatile memory device when SPO occurs, according to an embodiment.

FIG. 10 is a flowchart of operations between a memory controller and an NVM device when SPO occurs, according to an embodiment. In detail, FIG. 10 shows an embodiment in which a state group code is generated by the memory controller 100.

Referring to FIG. 10, the memory controller 100 may transmit a preprogram command with respect to multi-page data to the NVM device 200 in operation S310. The NVM device 200 may preprogram the multi-page data to memory cells in response to the preprogram command in operation S320.

The memory controller 100 may generate a state group code in operation S330. The memory controller 100 may generate the state group code based on the multi-page data. In an example embodiment, the memory controller 100 may generate the state group code based on multi-page data stored in the buffer memory 130. For example, the memory controller 100 may generate the state group data through a logic operation on bits in multi-bit data. The generated state group data may be temporarily stored in the buffer memory 130.

The memory controller 100 may detect SPO in operation S340. According to the detection of SPO, the memory controller 100 may transmit a state group code backup command to the NVM device 200 in operation S350. The memory controller 100 may transmit the generated state group code to the NVM device 200 together with the state group code backup command. For example, the memory controller 100 may transmit the command CMD and the address ADDR to the NVM device 200 such that the state group code is programmed in the SLC mode.

The NVM device 200 may back up the state group code in response to the state group code backup command in operation S360. For example, the NVM device 200 may program the state group code to memory cells, which correspond to the address ADDR, in the SLC mode.

Operating methods of the memory system 10 at the power recovery from SPO will be described in detail with reference to FIGS. 11 through 17B below.

Figure 11:
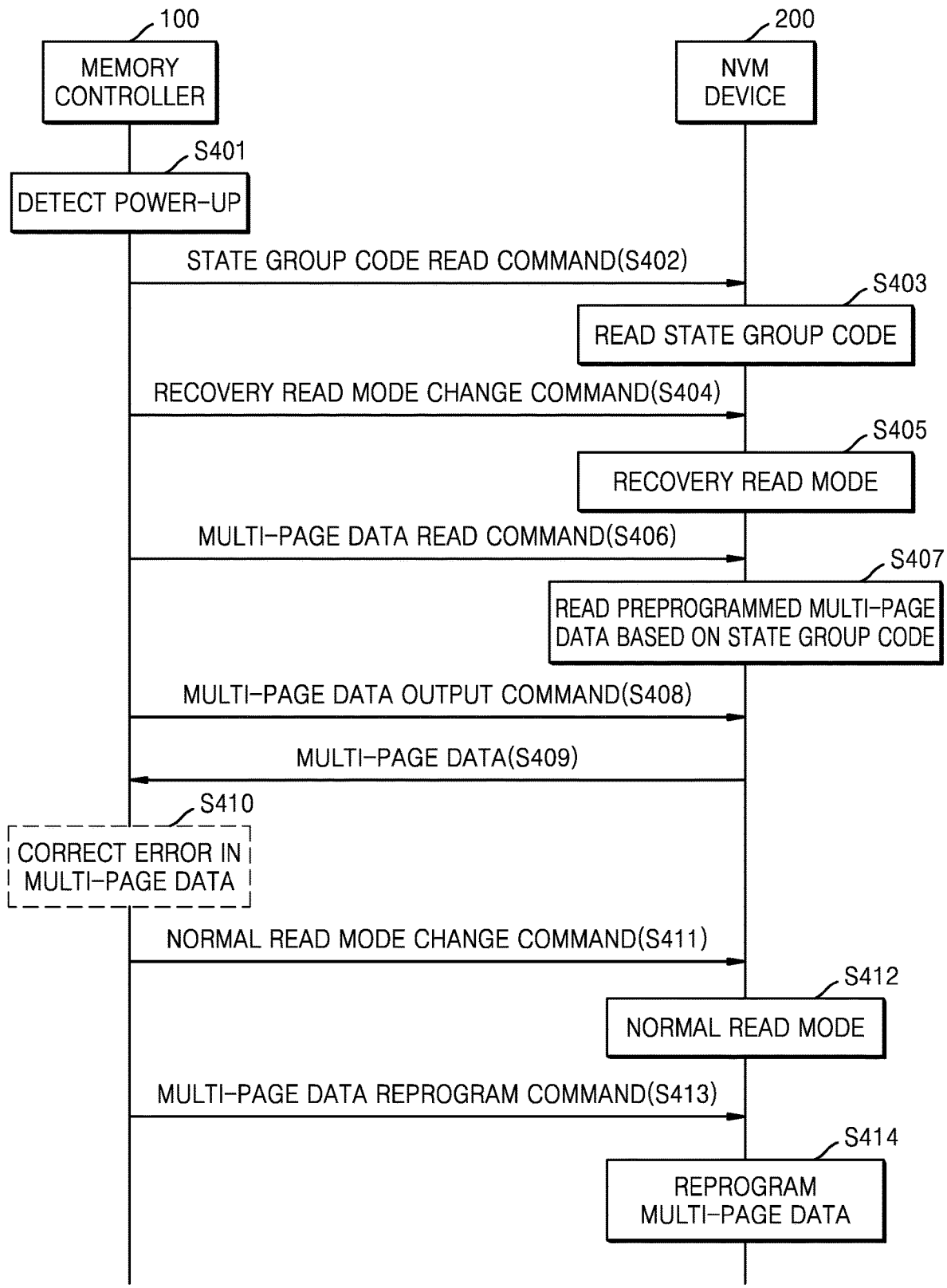
FIG. 11 is a flowchart of operations between a memory controller and a nonvolatile memory device when power is recovered from SPO, according to an embodiment.

FIG. 11 is a flowchart of operations between a memory controller and a nonvolatile memory device when power is recovered from SPO, according to an embodiment. Referring to FIG. 11, the memory controller 100 may detect power-up in operation S401. When power-up is detected, the memory controller 100 may determine that the power of the memory controller 100 is recovered.

The memory controller 100 may transmit a state group code read command to the NVM device 200 in operation S402. The memory controller 100 may transmit the state group code read command based on address information corresponding to preprogrammed memory cells. For example, the memory controller 100 may transmit the command CMD and the address ADDR to the NVM device 200 such that state group code is read in the SLC mode. In this case, the memory controller 100 may transmit another command CMD to the NVM device 200 to change the mode of the NVM device 200 into the SLC mode.

The NVM device 200 may read state group code in response to the state group code read command in operation S403. For example, the NVM device 200 may read the state group code from memory cells corresponding to the address ADDR in the SLC mode. The read state group code may be stored in the page buffer unit 220 in FIG. 5.

Although not shown in FIG. 11, when the state group code is stored in a different memory plane than multi-page data or when error correction of state group code is requested, the read state group code may be transmitted to the memory controller 100 according to an output command of the memory controller 100. In this case, the state group code provided to the memory controller 100 may be error-corrected by the ECC circuit 150 in FIG. 4 and then re-transmitted to the NVM device 200.

The memory controller 100 may transmit a recovery read mode change command to the NVM device 200 in operation S404. For example, the memory controller 100 may transmit the recovery read mode change command through the control signal CTRL or the command CMD. The NVM device 200 may change into a recovery read mode in response to the recovery read mode change command in operation S405. The NVM device 200 may perform a read operation in a different manner in the recovery read mode than in a normal read mode. For example, the NVM device 200 may perform a read operation using different read voltages in the recovery read mode than in the normal read mode.

The memory controller 100 may transmit a multi-page data read command to the NVM device 200 in operation S406. For example, the memory controller 100 may transmit the command CMD and the address ADDR to the NVM device 200 such that multi-page data is read in the QLC mode.

The NVM device 200 may read preprogrammed multi-page data in response to the multi-page data read command in operation S407. In the recovery read mode, the NVM device 200 may perform the read operation based on the state group code. For example, the NVM device 200 may read multi-page data from each of the preprogrammed memory cells using read voltages corresponding to state group data. For example, the read multi-page data may be stored in the page buffer unit 220 in FIG. 5. The read operation based on the state group code will be described in detail with reference to FIGS. 12 through 17B below.

The memory controller 100 may transmit a multi-page data output command to the NVM device 200 in operation S408. The NVM device 200 may output the read multi-page data in response to the multi-page data output command in operation S409. For example, the NVM device 200 may transmit multi-page data stored in the page buffer unit 220 to the memory controller 100. According to an embodiment, operation S408 may be skipped. For example, in response to the multi-page data read command, the NVM device 200 may perform the read operation and transmit the read multi-page data to the memory controller 100.

The memory controller 100 may correct an error in the multi-page data in operation S410. When there is no error in the multi-page data, the memory controller 100 does not perform error correction. Consequently, the multi-page data may be recovered, and the reliability of the recovered multi-page data may be increased. In an example embodiment, the error correction in operation S410 may be skipped.

In an example embodiment, operations S406 through S410 may be performed on each page. For example, the memory controller 100 may provide a read command to the NVM device 200 for each of four pages and may provide an output command to the NVM device 200 for each of four pages.

The memory controller 100 may transmit a normal read mode change command to the NVM device 200 in operation S411. For example, the memory controller 100 may transmit the normal read mode change command through the control signal CTRL or the command CMD. The NVM device 200 may change into the normal read mode in response to the normal read mode change command in operation S412. The NVM device 200 may perform a read operation using predetermined read voltages in the normal read mode, regardless of state group code.

The memory controller 100 may transmit a multi-page data reprogram command to the NVM device 200 in operation S413. The memory controller 100 may also transmit the multi-page data, which has been recovered in operation S410, to the NVM device 200 together with the multi-page data reprogram command. For example, when the multi-page data includes four pages, the memory controller 100 may transmit the command CMD and the address ADDR to the NVM device 200 such that the multi-page data is reprogrammed in the QLC mode.

The NVM device 200 may reprogram the multi-page data in response to the multi-page data reprogram command in operation S414. For example, the NVM device 200 may program the multi-page data to memory cells, which are indicated by the address ADDR, based on a reprogram verify voltage. The address ADDR provided for reprogramming may be the same as the address ADDR provided for pre-programming.

Figure 12:
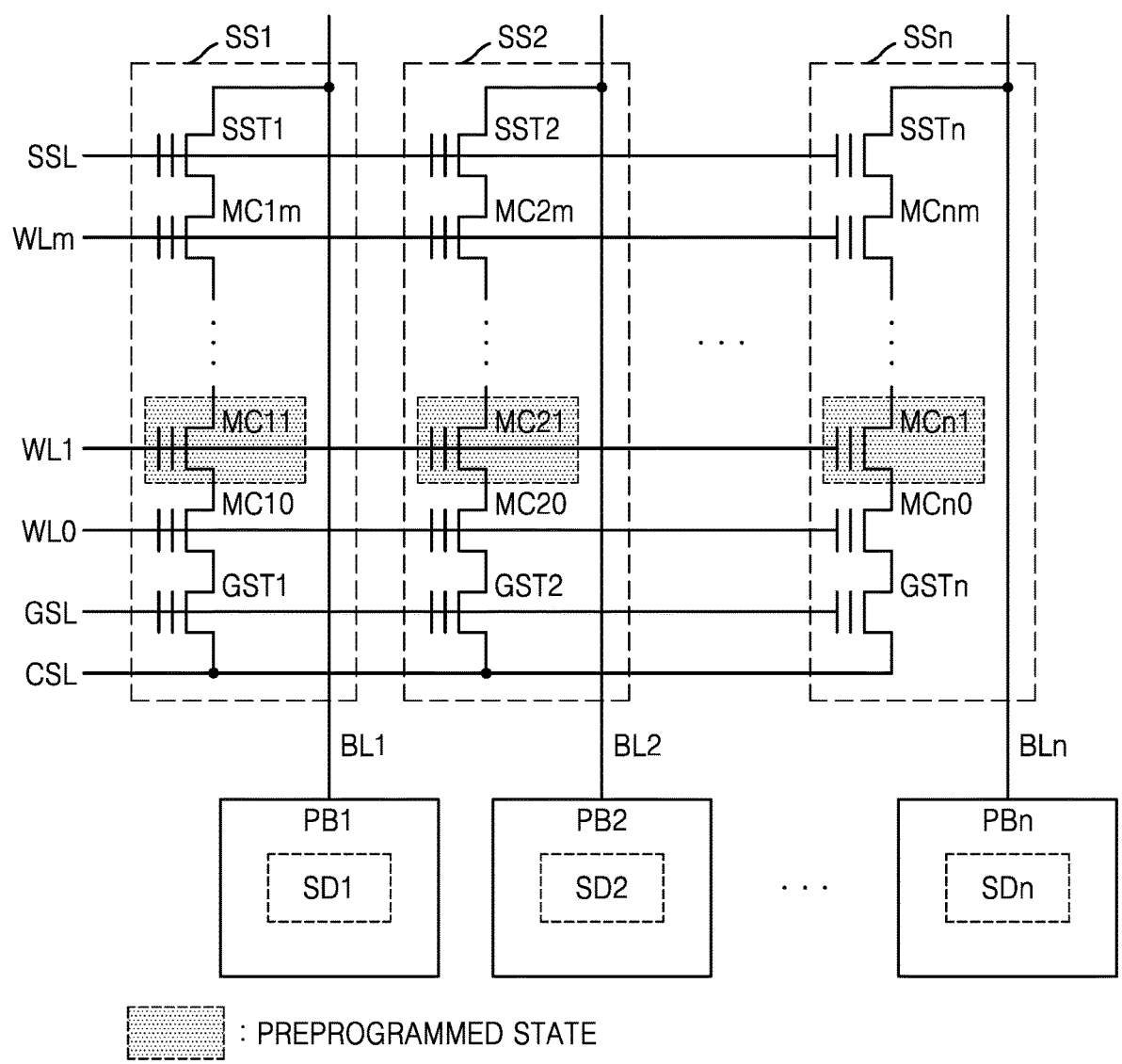
FIG. 12 is a diagram for describing a read operation of the nonvolatile memory device of FIG. 5.

FIG. 12 is a diagram for describing a read operation of the NVM device 200 of FIG. 5. Referring to FIG. 12, the NVM device 200 may include NAND strings SS1 through SSn and the first through n-th page buffers PB1 through PBn. The NAND strings SS1 through SSn may be respectively connected to the first through n-th page buffers PB1 through PBn through bit lines BL1 through BLn.

The NAND strings SS1 through SSn may include ground selection transistors GST1 through GSTn, memory cells MC10 through MCnm, and string selection transistors SST1 through SSTn. The ground selection transistors GST1 through GSTn may be connected to a common source line CSL and a ground selection line GSL, and the memory cells MC10 through MCnm may be connected to zeroth through m-th word lines WL0 through WLm. The string selection transistors SST1 through SSTn may be connected to a string selection line SSL and the bit lines BL1 through BLn.

The memory cells MC11 through MCn1 connected to the first word line WL1 among the memory cells MC10 through MCnm may be in a preprogrammed state. As described above with reference to FIGS. 8 through 10, multi-page data may be preprogrammed to the memory cells MC11 through MCn1 according to a preprogram command from the memory controller 100. For example, when the multi-page data includes the first through n-th multi-bit data MD1 through MDn, as shown in FIG. 7, the first multi-bit data MD1 may be preprogrammed to the memory cell MC11 and the second multi-bit data MD2 may be preprogrammed to the memory cell MC21.

The first through n-th page buffers PB1 through PBn may store a state group code including the first through n-th state group data SD1 through SDn. The first through n-th state group data SD1 through SDn may respectively correspond to the memory cells MC11 through MCn1 that have been preprogrammed. When a state group code read command or state group code is received from the memory controller 100, the state group code may be stored in the first through n-th page buffers PB1 through PBn. For example, the first page buffer PB1 may store the first state group data SD1 corresponding to the memory cell MC11, and the second page buffer PB2 may store the second state group data SD2 corresponding to the memory cell MC21.

When a read operation is performed on the memory cells MC11 through MCn1, which have been preprogrammed, in a normal read mode, normal read voltages may be applied to the first word line WL1 and multi-page data may be read from the memory cells MC11 through MCn1.

When a read operation is performed on the memory cells MC11 through MCn1, which have been preprogrammed, in a recovery read mode, recovery read voltages may be applied to the first word line WL1 and multi-page data may be read from the memory cells MC11 through MCn1. Levels of recovery read voltages may be different from levels of normal read voltages. For example, to read multi-bit data preprogrammed to the memory cell MC11, first recovery read voltages corresponding to the first state group data SD1 may be applied to the first word line WL1. To read multi-bit data preprogrammed to the memory cell MC21, second recovery read voltages corresponding to the second state group data SD2 may be applied to the first word line WL1. When the second state group data SD2 is the same as the first state group data SD1, the second recovery read voltages may be the same as the first recovery read voltages. When the second state group data SD2 is different from the first state group data SD1, the second recovery read voltages may be different from the first recovery read voltages. In other words, when recovery read voltages corresponding to each of values (e.g., "0" and "1") that the first through n-th state group data SD1 through SDn may have are applied to the first word line WL1, multi-page data may be read from the memory cells MC11 through MCn1.

Figure 13:
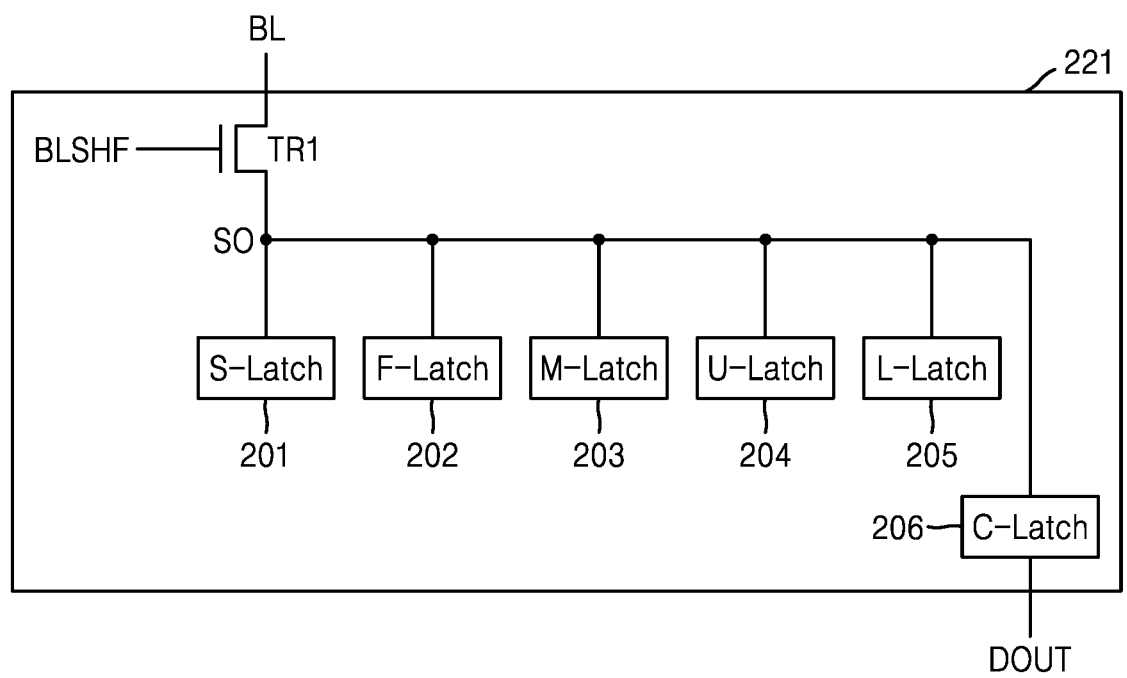
FIG. 13 is a block diagram of a page buffer according to an embodiment.

FIG. 13 is a block diagram of a page buffer according to an embodiment. Referring to FIG. 13, a page buffer 221 may include a sense latch (e.g., an S-latch) 201, a force latch (e.g., an F-latch) 202, a high-order bit latch (e.g., an M-latch) 203, an intermediate bit latch (e.g., a U-latch) 204, a low-order bit latch (e.g., an L-latch) 205, and a cache latch (e.g., a C-latch) 206, which are connected to a sensing node SO. The page buffer 221 may further include a first transistor TR1 connected between a bit line BL and the sensing node SO.

The sense latch 201 may store a result of sensing data stored in a memory cell or a result of sensing a threshold voltage of the memory cell in a read operation or a program verify operation. The sense latch 201 may also be used to apply a program bit line voltage or a program-inhibit voltage to the bit line BL in a program operation.

The force latch 202 may be used to improve threshold voltage variation in a program operation. A value stored in the force latch 202 may vary with a threshold voltage of a memory cell during a program operation, and a voltage applied to the bit line BL during the program operation may vary with the value stored in the force latch 202.

The high-order bit latch 203, the intermediate bit latch 204, the low-order bit latch 205, and the cache latch 206 may be used to store externally input data during a program operation and may be referred to as data latches. The number of data latches may vary with embodiments. For example, when 4-bit data is programmed to a single memory cell, four bits in the 4-bit data may be respectively stored in the high-order bit latch 203, the intermediate bit latch 204, the low-order bit latch 205, and the cache latch 206. For example, when 5-bit data is programmed to a single memory cell, the page buffer 221 may further include a second intermediate bit latch, and five bits in the 5-bit data may be respectively stored in the high-order bit latch 203, the intermediate bit latch 204, the second intermediate bit latch, the low-order bit latch 205, and the cache latch 206. However, embodiments are not limited thereto, and the page buffer 221 may further include at least two data latches. Until programming is completed, the high-order bit latch 203, the intermediate bit latch 204, the low-order bit latch 205, and the cache latch 206 may retain data stored therein. In addition, the cache latch 206 may receive data read from a memory cell from the sense latch 201 and output the data to the outside of the page buffer 221 through a data output line DOUT in a read operation.

In an example embodiment, at least one of the data latches, i.e., the high-order bit latch 203, the intermediate bit latch 204, the low-order bit latch 205, and the cache latch 206, may temporarily store state group data. Alternatively, the page buffer 221 may further include at least one state group data latch, which temporarily stores state group data.

The first transistor TR1 may be driven by a bit line shut-off signal BLSHF controlling connection between the bit line BL and the sensing node SO and thus be referred to as a "bit line shut-off transistor". For example, when data is read from a memory cell, the first transistor TR1 is turned on and electrically connects the bit line BL to the sense latch 201. In addition, when data stored in the sense latch 201 is transmitted to the cache latch 206 or when data stored in the cache latch 206 is transmitted to the force latch 202, the first transistor TR1 may be turned off.

Figure 14:
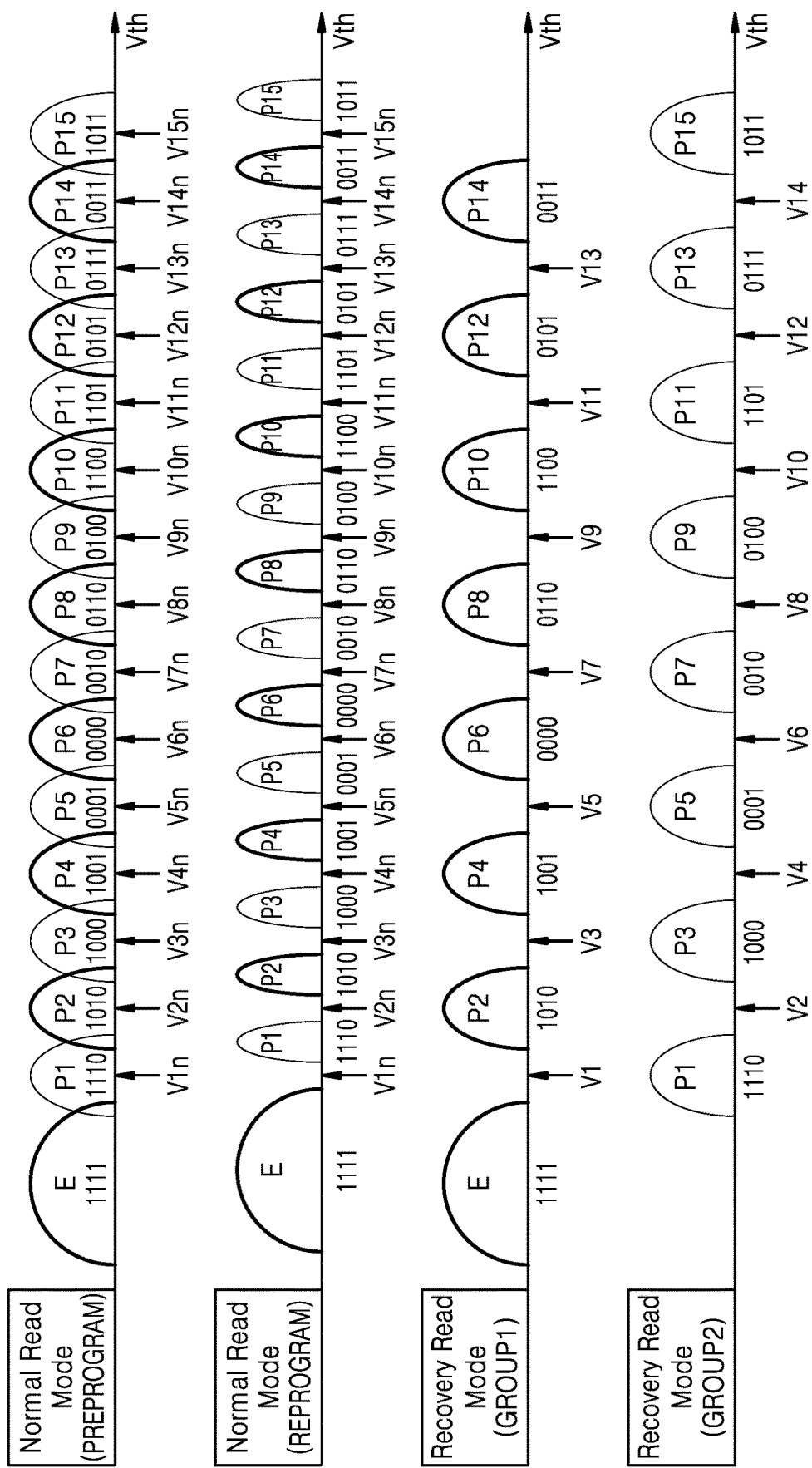
FIG. 14 shows graphs of examples of read voltages in a normal read mode and a recovery read mode, according to an embodiment.

FIG. 14 shows graphs of examples of read voltages in a normal read mode and a recovery read mode, according to an embodiment. Referring to FIGS. 12 and 14, each of the memory cells MC11 through MCn1 that have been preprogrammed may correspond to one of a plurality of threshold voltage distributions, e.g., the erased state E and the first through fifteenth programmed states P1 through P15, according to a multi-bit data value. For example, when multi-bit data "1111" is preprogrammed to the memory cell MC11, the memory cell MC11 may be in the erased state E. When multi-bit data "1110", "1010", "1000", "1001", "0001", "0000", "0010", "0110", "0100", "1100", "1101", "0101", "0111", "0011", or "1011" is preprogrammed to the memory cell MC11, the memory cell MC11 may be in one of the first through fifteenth programmed states P1 through P15. However, embodiments are not limited thereto, and a multi-bit data value corresponding to each of threshold voltage distributions, e.g., the erased state E and the first through fifteenth programmed states P1 through P15. In an example embodiment, the states having an odd number of "1" bit (e.g., states P1, P3, P5, P7, P8, P9, P11, P13, and P15) and the states having an even number of "1" bit (e.g., the erased states E, the states P2, P4, P6, P8, P10, P12 and P14) may be alternately arranged.

Each of the memory cells MC11 through MCn1 that have been preprogrammed may correspond to one of threshold voltage distributions, e.g., the erased state E and the second, fourth, sixth, eighth, tenth, twelfth, and fourteenth programmed states P2, P4, P6, P8, P10, P12, and P14, of the first state group GROUP1 or one of threshold voltage distributions, e.g., the first, third, fifth, seventh, ninth, eleventh, thirteenth, and fifteenth programmed states P1, P3, P5, P7, P9, P11, P13, and P15, of the second state group GROUP2. For example, the memory cell MC11 preprogrammed with the multi-bit data "1111", "1010", "1001", "0000", "0110", "1100", "0101", or "0011" may correspond to the first state group GROUP1; and the memory cell MC11 preprogrammed with the multi-bit data "1110", "1000", "0001", "0010", "0100", "1101", "0111", or "1011" may correspond to the second state group GROUP2. For example, the first state group GROUP1 may correspond to state group data "0" and the second state group GROUP2 may correspond to state group data "1".

In a normal read mode, first through fifteenth normal read voltages V1$n$ through V15$n$ may be used to read multi-page data from the memory cells MC11 through MCn1 that have been preprogrammed. For example, as shown in FIG. 14, the first through fifteenth normal read voltages V1$n$ through V15$n$ may be used to read multi-page data from memory cells, on which a program operation is completed by reprogramming. When the multi-page data are read from the memory cells MC11 through MCn1 after being preprogrammed and before being reprogramming with the first through fifteenth normal read voltages V1$n$ through V15$n$, the state of each of the memory cells MC11 through MCn1 that have been preprogrammed may not be accurately identified due to the overlap between threshold voltage distributions of two adjacent states, and a read multi-bit data value may be different from a data value stored in a preprogrammed memory cell. The reliability of the read multi-bit data may be decreased. Accordingly, when reprogramming is resumed, after power being recovered from the SPO, based on the multi-page data read in the normal read mode, the reliability of the programmed multi-page data may be decreased.

In a recovery read mode, first through fourteenth recovery read voltages V1 through V14 may be used to read multi-page data from the memory cells MC11 through MCn1 that have been preprogrammed. First recovery read voltages, e.g., the first, third, fifth, seventh, ninth, eleventh, and thirteenth recovery read voltages V1, V3, V5, V7, V9, V11, and V13, may be used to read multi-page data from memory cells corresponding to the first state group GROUP1 among the memory cells MC11 through MCn1 that have been preprogrammed. Second recovery read voltages, e.g., the second, fourth, sixth, eighth, tenth, twelfth, and fourteenth recovery read voltages V2, V4, V6, V8, V10, V12, and V14, may be used to read multi-page data from memory cells corresponding to the second state group GROUP2 among the memory cells MC11 through MCn1 that have been preprogrammed. For example, when one of the multi-bit data "1111", "1010", "1001", "0000", "0110", "1100", "0101", or "0011" has been preprogrammed to the memory cell MC11 of FIG. 12, for example, the multi-bit data may be read from the memory cell MC11 based on the first recovery read voltages, e.g., the first, third, fifth, seventh, ninth, eleventh, and thirteenth recovery read voltages V1, V3, V5, V7, V9, V11, and V13. For example, when one of the multi-bit data "1110", "1000", "0001", "0010", "0100", "1101", "0111", or "1011" has been preprogrammed to the memory cell MC11, the multi-bit data may be read from the memory cell MC11 based on the second recovery read voltages, e.g., the second, fourth, sixth, eighth, tenth, twelfth, and fourteenth recovery read voltages V2, V4, V6, V8, V10, V12, and V14. In an example embodiment, it is determined using the first state group data SD1 whether the memory cell MC11 is read using the first recovery read voltages or using the second recovery read voltages. For example, when the first state group data SD1 is "0", the memory cell MC1 may correspond to the first state group GROUP1 and the multi-bit data preprogrammed in the memory cell MC11 may be read in the recovery read mode using the first recovery read voltages V1, V3, V5, V7, V9, V11 and V13. The memory cell MC11 of the first stage group GROUP1 may have one of the states the erased state E and the even-numbered states P2, P4, P6, P8, P10, P12 and P14. Two adjacent states among the erased state E and the even-numbered states P2, P4, P6, P8, P10, P12 and P14 may be spaced apart from each other without overlapping, and thus memory cell MC11 may be read using the first recovery read voltages V1, V3, V5, V7, V9, V11 and V13. For example, when the first state group data SD1 is "1", the memory cell MC11 may correspond to the second state group GROUP2 and the multi-bit data preprogrammed in the memory cell MC11 may be read in the recovery read mode using the second recovery read voltages V2, V4, V6, V8, V10, V12 and V14. The memory cell MC11 of the first stage group GROUP2 may have one of the odd-numbered states P1, P3, P5, P7, P9, P11 and P13. Two adjacent states among the odd-numbered states P1, P3, P5, P7, P9, P11 and P13 may be spaced apart from each other without overlapping, and thus memory cell MC11 may be read using the second recovery read voltages V2, V4, V6, V8, V10, V12 and V14.

At this time, the first recovery read voltages, e.g., the first, third, fifth, seventh, ninth, eleventh, and thirteenth recovery read voltages V1, V3, V5, V7, V9, V11, and V13, corresponding to the first state group GROUP1 may be different from the second recovery read voltages, e.g., the second, fourth, sixth, eighth, tenth, twelfth, and fourteenth recovery read voltages V2, V4, V6, V8, V10, V12, and V14, corresponding to the second state group GROUP2. In addition, recovery read voltages, e.g., the first through fourteenth recovery read voltages V1 through V14, used in the recovery read mode may be different from normal read voltages, e.g., first through fifteenth normal read voltages V1$n$ through V15$n$, used in the normal read mode.

As described above, the recovery read voltages, e.g., the first through fourteenth recovery read voltages V1 through V14, different from normal read voltages, e.g., first through fifteenth normal read voltages V1$n$ through V15$n$, may be used in the recovery read mode. The state of each of the memory cells MC11 through MCn1 that have been preprogrammed may be relatively accurately identified, and a read multi-bit data value may be identical to a data value stored in a preprogrammed memory cell. The reliability of the read multi-bit data may be increased. Accordingly, when reprogramming is performed based on the multi-page data read in the recovery read mode, the reliability of the programmed multi-page data may be increased.

FIG. 15 is a table showing examples of read voltages in a normal read mode, according to an embodiment. Referring to FIGS. 12 through 15, when multi-page data is read from the memory cells MC11 through MCn1 that have been preprogrammed in the normal read mode, read voltages may be applied to the first word line WL1 based on a normal read voltage table NRVT. Different read voltages may be applied for each page.

For example, when threshold voltage distributions correspond to multi-bit data values as shown in FIG. 14, the first, fourth, sixth, and eleventh normal read voltages V1$n$, V4$n$, V6$n$, and V11$n$ may be applied to the first word line WL1 to read first page data of the multi-page data. The third, seventh, ninth, and thirteenth normal read voltages V3$n$, V7$n$, V9$n$, and V13$n$ may be applied to the first word line WL1 to read second page data of the multi-page data. The second, eighth, and fourteenth normal read voltages V2$n$, V8$n$, and V14$n$ may be applied to the first word line WL1 to read third page data of the multi-page data. The fifth, tenth, twelfth, and fifteenth normal read voltages V5$n$, V10$n$, V12$n$, and V15$n$ may be applied to the first word line WL1 to read fourth page data of the multi-page data. In this case, read voltages may be sequentially applied in ascending order of levels, but the order of applying the read voltages may be variously changed.

FIG. 16 is a table showing examples of read voltages in the recovery read mode, according to an embodiment. Referring to FIGS. 12 through 16, when multi-page data is read from the memory cells MC11 through MCn1 that have been preprogrammed in the recovery read mode, read voltages may be applied to the first word line WL1 based on a recovery read voltage table RRVT. In this case, different read voltages may be applied for each page.

For example, when threshold voltage distributions correspond to multi-bit data values as shown in FIG. 14, the first, third, fifth, and eleventh recovery read voltages V1, V3, V5, and V11 corresponding to the first state group GROUP1 and the fourth, sixth, and tenth recovery read voltages V4, V6, and V10 corresponding to the second state group GROUP2 may be applied to the first word line WL1 to read the first page data of the multi-page data. The first page data may be read from memory cells corresponding to the first state group GROUP1 by the first, third, fifth, and eleventh recovery read voltages V1, V3, V5, and V11 and may be read from memory cells corresponding to the second state group GROUP2 by the fourth, sixth, and tenth recovery read voltages V4, V6, and V10. The third, seventh, ninth, and thirteenth recovery read voltages V3, V7, V9, and V13 corresponding to the first state group GROUP1 and the second, sixth, eighth, and twelfth recovery read voltages V2, V6, V8, and V12 corresponding to the second state group GROUP2 may be applied to the first word line WL1 to read the second page data of the multi-page data. The second page data may be read from memory cells corresponding to the first state group GROUP1 by the third, seventh, ninth, and thirteenth recovery read voltages V3, V7, V9, and V13 and may be read from memory cells corresponding to the second state group GROUP2 by the second, sixth, eighth, and twelfth recovery read voltages V2, V6, V8, and V12. Similarly, the first, seventh, and thirteenth recovery read voltages V1, V7, and V13 corresponding to the first state group GROUP1 and the second, eighth, and fourteenth recovery read voltages V2, V8, and V14 corresponding to the second state group GROUP2 may be applied to the first word line WL1 to read the third page data of the multi-page data; and the fifth, ninth, and eleventh recovery read voltages V5, V9, and V11 corresponding to the first state group GROUP1 and the fourth, tenth, twelfth, and fourteenth recovery read voltages V4, V10, V12, and V14 corresponding to the second state group GROUP2 may be applied to the first word line WL1 to read the fourth page data of the multi-page data In this case, read voltages may be sequentially applied in ascending order of levels, but the order of applying the read voltages may be variously changed.

As described above, in the recovery read mode, recovery read voltages corresponding to each of state groups may be applied to the first word line WL1 to read a single page.

In an example embodiment, each of the first through n-th page buffers PB1 through PBn may output data only sensed by recovery read voltages corresponding to state group data stored therein. For example, first data may be sensed from the memory cell MC11 by recovery read voltages corresponding to the first state group GROUP1, and second data may be sensed from the memory cell MC11 by recovery read voltages corresponding to the second state group GROUP2.

The sensed first and second data may be stored in the sense latch 201, the force latch 202, the high-order bit latch 203, the intermediate bit latch 204, and the low-order bit latch 205 in FIG. 13. The first page buffer PB1 may output only either the first data or the second data through the cache latch 206 based on state group data stored in at least one latch among the sense latch 201, the force latch 202, the high-order bit latch 203, the intermediate bit latch 204, and the low-order bit latch 205.

In an example embodiment, each of the first through n-th page buffers PB1 through PBn may output data sensed by recovery read data corresponding to all state group data. For example, first data may be sensed from the memory cell MC11 by recovery read voltages corresponding to the first state group GROUP1, and second data may be sensed from the memory cell MC11 by recovery read voltages corresponding to the second state group GROUP2. The sensed first and second data may be stored in the sense latch 201, the force latch 202, the high-order bit latch 203, the intermediate bit latch 204, and the low-order bit latch 205 in FIG. 13. The first page buffer PB1 may output both the first data and the second data through the cache latch 206. In this case, the memory controller 100 may select one of the first data and the second data, which are provided from the NVM device 200, based on state group data therein.

In an example embodiment, the command CMD and the address ADDR may be provided for each page to read multi-page data in a recovery read mode. For example, four commands CMD may be provided to read all multi-page data including four pages. In this case, the number of recovery read voltage levels applied according to a single command CMD may be greater than the number of normal read voltage levels applied according to a single command CMD in a normal read mode. For example, the first, third, fifth, and eleventh recovery read voltages V1, V3, V5, and V11 corresponding to the first state group GROUP1 and the fourth, sixth, and tenth recovery read voltages V4, V6, and V10 corresponding to the second state group GROUP2 may be applied according to the command CMD for reading first page data in the recovery read mode. The first, fourth, sixth, and eleventh normal read voltages V1$n$, V4$n$, V6$n$, and V11$n$ may be applied according to the command CMD for reading the first page data in the normal read mode. In this case, the number of recovery read voltage levels applied according to a single command CMD may be seven, and the number of normal read voltage levels applied according to a single command CMD may be four.

Figure 17A:
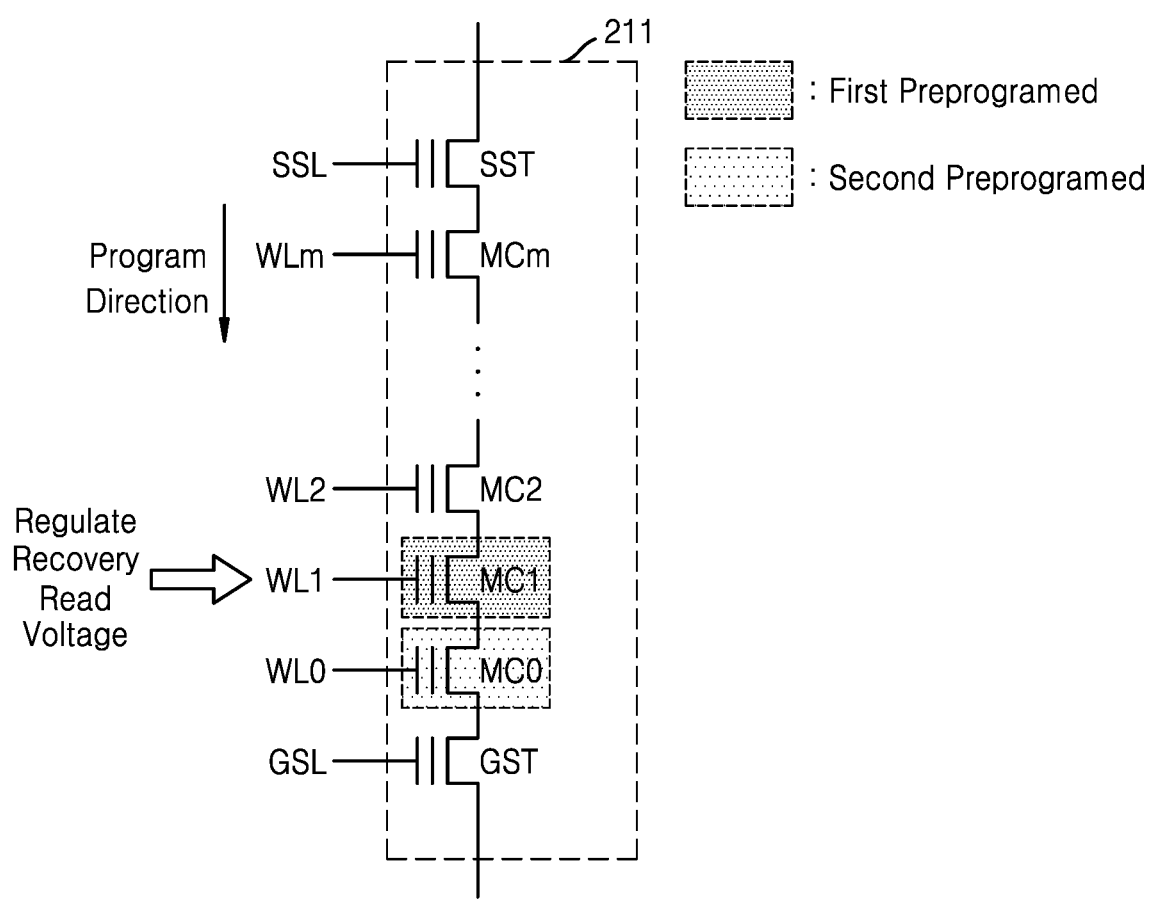
FIGS. 17A and 17B show examples of regulating a recovery read voltage, according to embodiments.
Figure 17B:
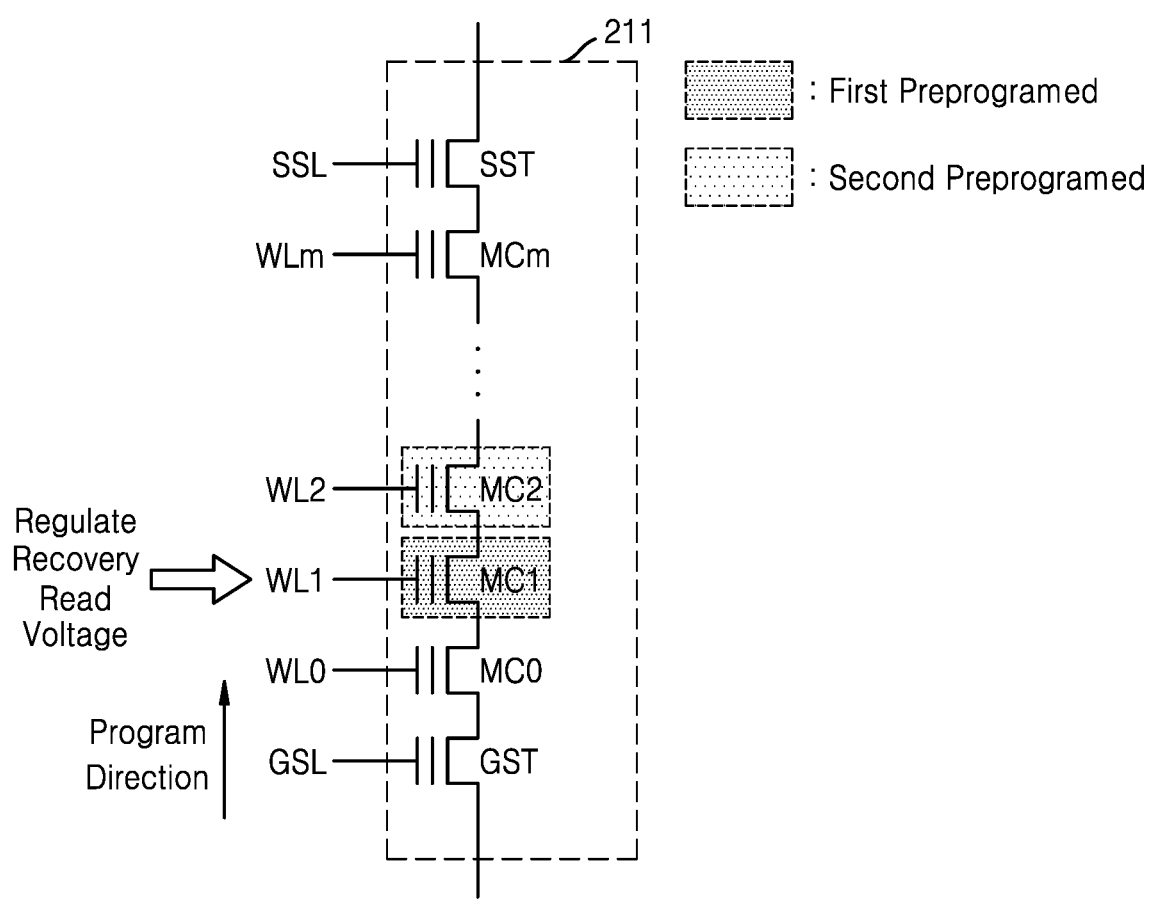

FIGS. 17A and 17B show examples of regulating a recovery read voltage, according to embodiments. Referring to FIG. 17A, a NAND string 211 may include zeroth through m-th memory cells MC0 through MCm. In a program operation on the zeroth through m-th memory cells MC0 through MCm, programming may be sequentially performed starting from the m-th memory cell MCm to the zeroth memory cell MC0. A memory cell closer to the string selection transistor SST may be programmed earlier, and a memory cell farther from the string selection transistor SST may be programmed later. For example, after the first memory cell MC1 is preprogrammed, the zeroth memory cell MC0 may be preprogrammed.

When power is recovered from SPO after the first memory cell MC1 connected to the first word line WL1 of the NAND string 211 is preprogrammed, multi-bit data may be read from the first memory cell MC1 based on recovery read voltages in a recovery read mode. The recovery read voltages may be regulated according to the state of the zeroth memory cell MC0 adjacent to the first memory cell MC1. For example, when the zeroth memory cell MC0 is in a preprogrammed state, the recovery read voltages applied to the first word line WL1 may be increased or decreased. Accordingly, the regulated recovery read voltages are applied to the first word line WL1 so that the multi-bit data may be read from the first memory cell MC1.

Referring to FIG. 17B, in a program operation on the zeroth through m-th memory cells MC0 through MCm, programming may be sequentially performed starting from the zeroth memory cell MC0 to the m-th memory cell MCm. A memory cell closer to the ground selection transistor GST may be programmed earlier, and a memory cell farther from the ground selection transistor GST may be programmed later. For example, after the first memory cell MC1 is preprogrammed, the second memory cell MC2 may be preprogrammed.

When power is recovered from SPO after the first memory cell MC1 connected to the first word line WL1 of the NAND string 211 is preprogrammed, multi-bit data may be read from the first memory cell MC1 based on recovery read voltages in a recovery read mode. The recovery read voltages may be regulated according to the state of the second memory cell MC2 adjacent to the first memory cell MC1. For example, when the second memory cell MC2 is in a preprogrammed state, the recovery read voltages applied to the first word line WL1 may be increased or decreased. Accordingly, the regulated recovery read voltages are applied to the first word line WL1 so that the multi-bit data may be read from the first memory cell MC1.

As described above, when the first memory cell MC1 is preprogrammed and then the zeroth or second memory cell MC0 or MC2 adjacent to the first memory cell MC1 is preprogrammed, the threshold voltage of the first memory cell MC1 may be changed by a program voltage applied to the zeroth word line WL0 connected to the zeroth memory MC0 adjacent to the first memory cell MC1 or the second word line WL2 connected to the second memory cell MC2 adjacent to the first memory cell MC1. Accordingly, the recovery read voltages are regulated according to the preprogrammed state of the adjacent memory cell, e.g., the zeroth memory cell MC0 or the second memory cell MC2 to compensate for the change in the threshold voltage of the first memory cell MC1.

Figure 18:
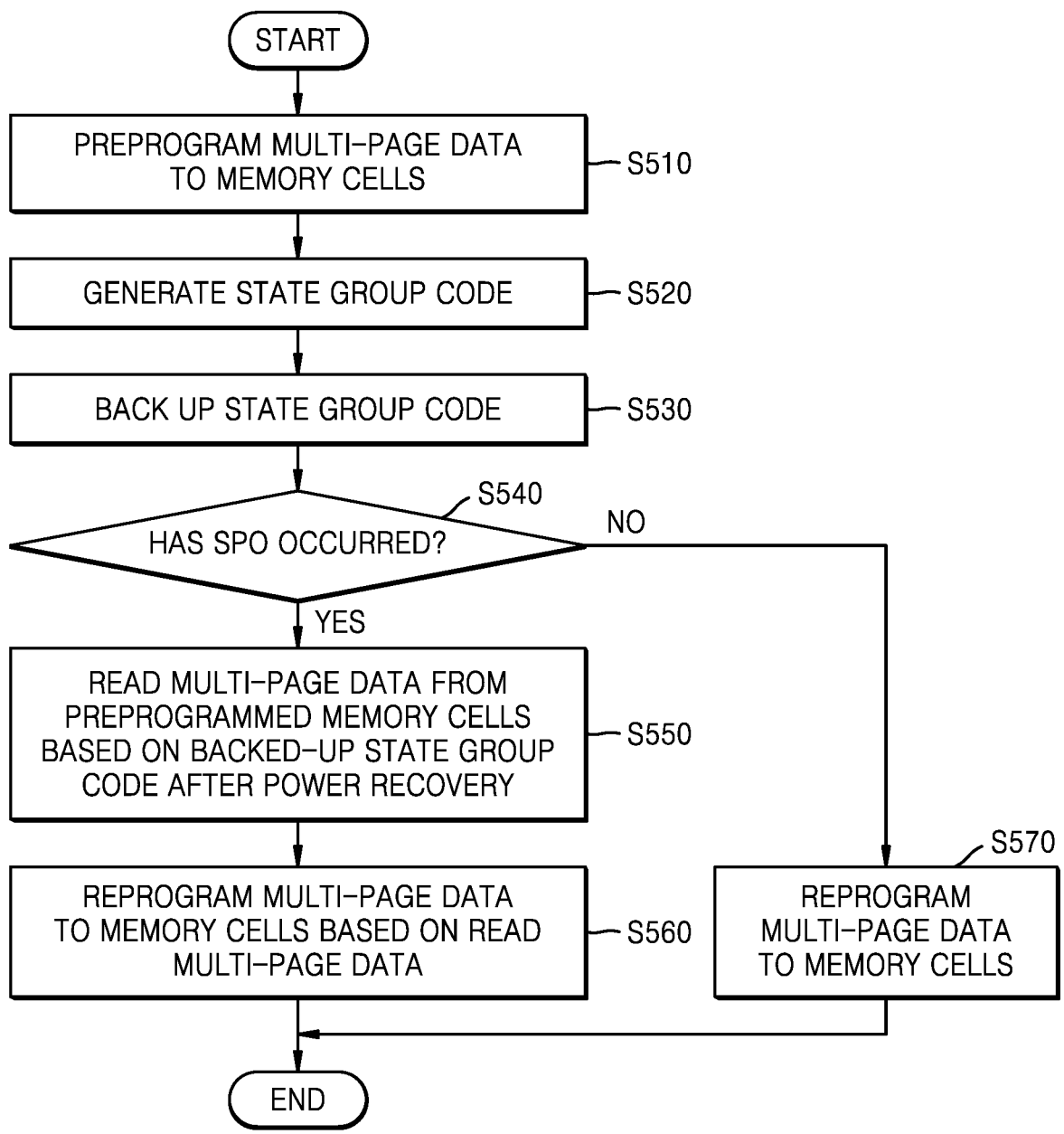
FIG. 18 is a flowchart of an operating method of a memory system, according to an embodiment.

FIG. 18 is a flowchart of an operating method of a memory system, according to an embodiment. Referring to FIGS. 1 and 18, the memory system 10 may preprogram multi-page data to memory cells in operation S510. The memory system 10 may generate a state group code based on the multi-page data in operation S520.

The memory system 10 may back up the state group code to the NVM device 200 in operation S530. The memory system 10 may determine whether SPO has occurred in operation S540. When SPO has occurred, the memory system 10 may read the multi-page data from the preprogrammed memory cells based on the backed-up state group code after a power recovery in operation S550. For example, the memory system 10 may read the multi-page data based on the state group code, as described above with reference to FIGS. 11 through 17B.

The memory system 10 may reprogram the multi-page data to memory cells based on the read multi-page data in operation S560. The reprogrammed memory cells may be the same as the preprogrammed memory cells.

When SPO does not occur after the preprogramming, the memory system 10 may reprogram the multi-page data to the memory cells in operation S570. The memory system 10 may reprogram the multi-page data based on multi-page data stored in the buffer memory 130 of the memory controller 100.

According to the embodiment of FIG. 18, the memory system 10 may generate and back up a state group code regardless of occurrence of SPO. For example, the state group code may be generated and backed up before operation S40 in which the occurrence of SPO is checked. A state group code may be backed up to the NVM device 200 for each preprogrammed multi-page data. Because the backup of state group code is not performed at the occurrence of SPO, the size and capacity of an auxiliary power supply used to back up the state group code may be further reduced compared to the embodiment of FIG. 8 in which operation S240 of backing up the state group code is performed after the occurrence of SPO.

Figure 19:
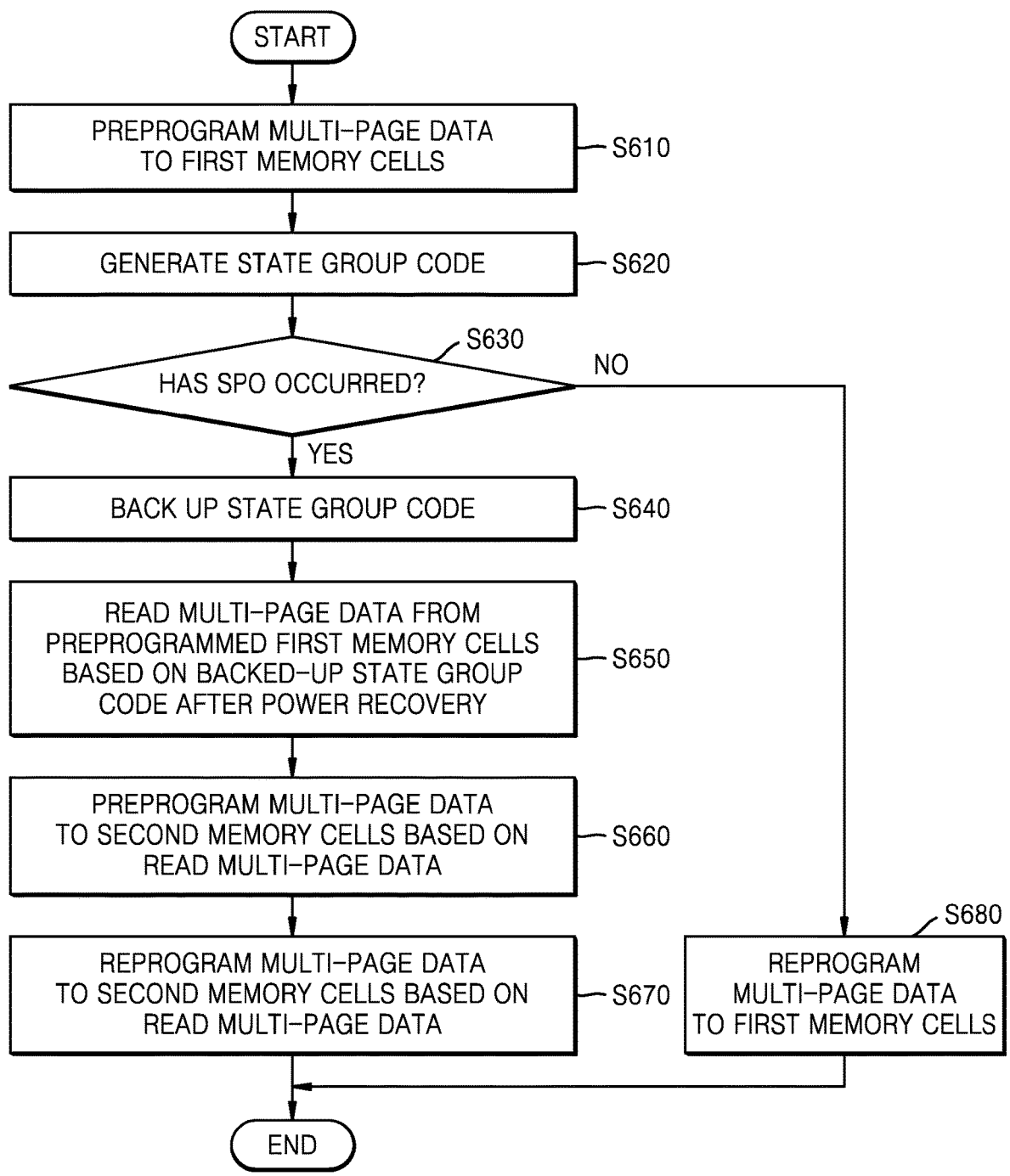
FIG. 19 is a flowchart of an operating method of a memory system, according to an embodiment.

FIG. 19 is a flowchart of an operating method of a memory system, according to an embodiment. Referring to FIGS. 1 and 19, the memory system 10 may preprogram multi-page data to first memory cells in operation S610. The memory system 10 may generate state group code based on the multi-page data in operation S620.

The memory system 10 may determine whether SPO has occurred in operation S630. When SPO has occurred, the memory system 10 may back up the state group code to the NVM device 200 in operation S640. The memory system 10 may read the multi-page data from the preprogrammed first memory cells based on the backed-up state group code after a power recovery in operation S650. For example, the memory system 10 may read the multi-page data based on the state group code, as described above with reference to FIGS. 11 through 17B.

Instead of reprogramming first cells which are preprogrammed, the memory system 10 may preprogram second memory cells different from the first memory cells using the multi-page data read in operation S650. For example, the memory system 10 may preprogram the multi-page data to the second memory cells based on the read multi-page data in operation S660. The memory system 10 may reprogram the multi-page data to the second memory cells based on the read multi-page data in operation S670. The second memory cells may be included in a different memory block than a memory block of the first memory cells, but embodiments are not limited thereto.

When SPO does not occur after the preprogramming, the memory system 10 may reprogram the multi-page data to the first memory cells in operation S680. The memory system 10 may reprogram the multi-page data based on multi-page data stored in the buffer memory 130 of the memory controller 100.

According to the embodiment of FIG. 19, the memory system 10 may program the multi-page data to the second memory cells different from the first memory cells preprogrammed after a power recovery from SPO. For example, when a program operation may no longer be performed on the first memory cells, the memory system 10 may newly perform a program operation on the second memory cells based on the recovered multi-page data.

Figure 20:
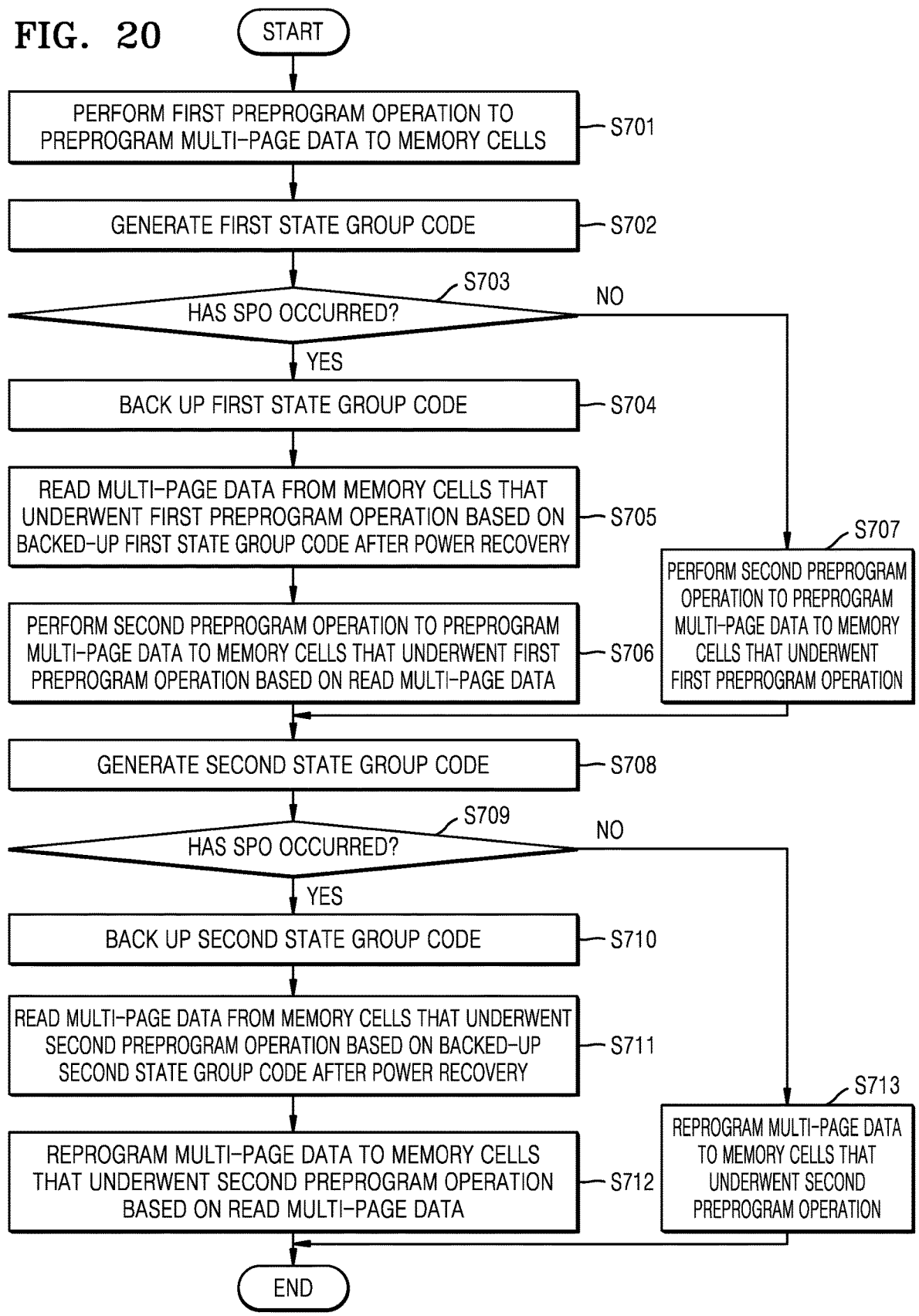
FIG. 20 is a flowchart of an operating method of a memory system, according to an embodiment.

FIG. 20 is a flowchart of an operating method of a memory system, according to an embodiment. Referring to FIGS. 1 and 20, the memory system 10 may perform a first preprogram operation to preprogram multi-page data to memory cells in operation S701. The memory system 10 may generate a first state group code based on multi-page data in operation S702.

The memory system 10 may determine whether SPO has occurred in operation S703. When SPO has occurred, the memory system 10 may back up the first state group code to the NVM device 200 in operation S704. The memory system 10 may read the multi-page data from the memory cells, which have undergone the first preprogram operation, based on the backed-up first state group code after a power recovery in operation S705. The memory system 10 may perform a second preprogram operation to preprogram the multi-page data to the memory cells, which have undergone the first preprogram operation, based on the read multi-page data in operation S706. For example, a preprogram verify voltage of the second preprogram operation may be higher than a preprogram verify voltage of the first preprogram operation.

When SPO does not occur after the first preprogram operation, the memory system 10 may perform the second preprogram operation to preprogram multi-page data to the memory cells, which have undergone the first preprogram operation, in operation S707. The memory system 10 may perform the second preprogram operation based on multi-page data stored in the buffer memory 130 of the memory controller 100.

The memory system 10 may generate a second state group code based on the multi-page data in operation S708. For example, overlapping regions among threshold voltage distributions resulting from the second preprogram operation may be reduced compared to overlapping regions among threshold voltage distributions resulting from the first preprogram operation. Accordingly, the number of state groups for classifying the threshold voltage distributions resulting from the second preprogram operation may be less than the number of state groups for classifying the threshold voltage distributions resulting from the first preprogram operation. Therefore, the number of bits in the second state group code may be less than the number of bits in the first state group code.

The memory system 10 may determine whether SPO has occurred in operation S709. When SPO has occurred, the memory system 10 may back up the second state group code to the NVM device 200 in operation S710. The memory system 10 may read the multi-page data from the memory cells, which have undergone the second preprogram operation, based on the backed-up second state group code after a power recovery in operation S711. The memory system 10 may reprogram the multi-page data to the memory cells, which have undergone the second preprogram operation, based on the read multi-page data in operation S712. For example, a reprogram verify voltage for the reprogramming may be higher than the preprogram verify voltage for the second preprogram operation.

When SPO does not occur after the second preprogram operation, the memory system 10 may reprogram multi-page data to the memory cells, which have undergone the second preprogram operation, in operation S713. When SPO has occurred in operation S703, the memory system 10 may perform reprogramming based on the multi-page data read from the memory cells, which have undergone the first preprogram operation. When SPO has not occurred in operation S703, the memory system 10 may perform reprogramming based on the multi-page data stored in the buffer memory 130 of the memory controller 100.

As described above, the memory system 10 may perform a plurality of preprogram operations. The memory system 10 may generate a state group code (i.e., state group data) in correspondence to each of the preprogram operations. The number of bits in the state group data may vary with the preprogram operations, and the number of bits in state group data corresponding to an earlier preprogram operation may be greater than the number of bits in state group data corresponding to a later preprogram operation.

Figure 21:
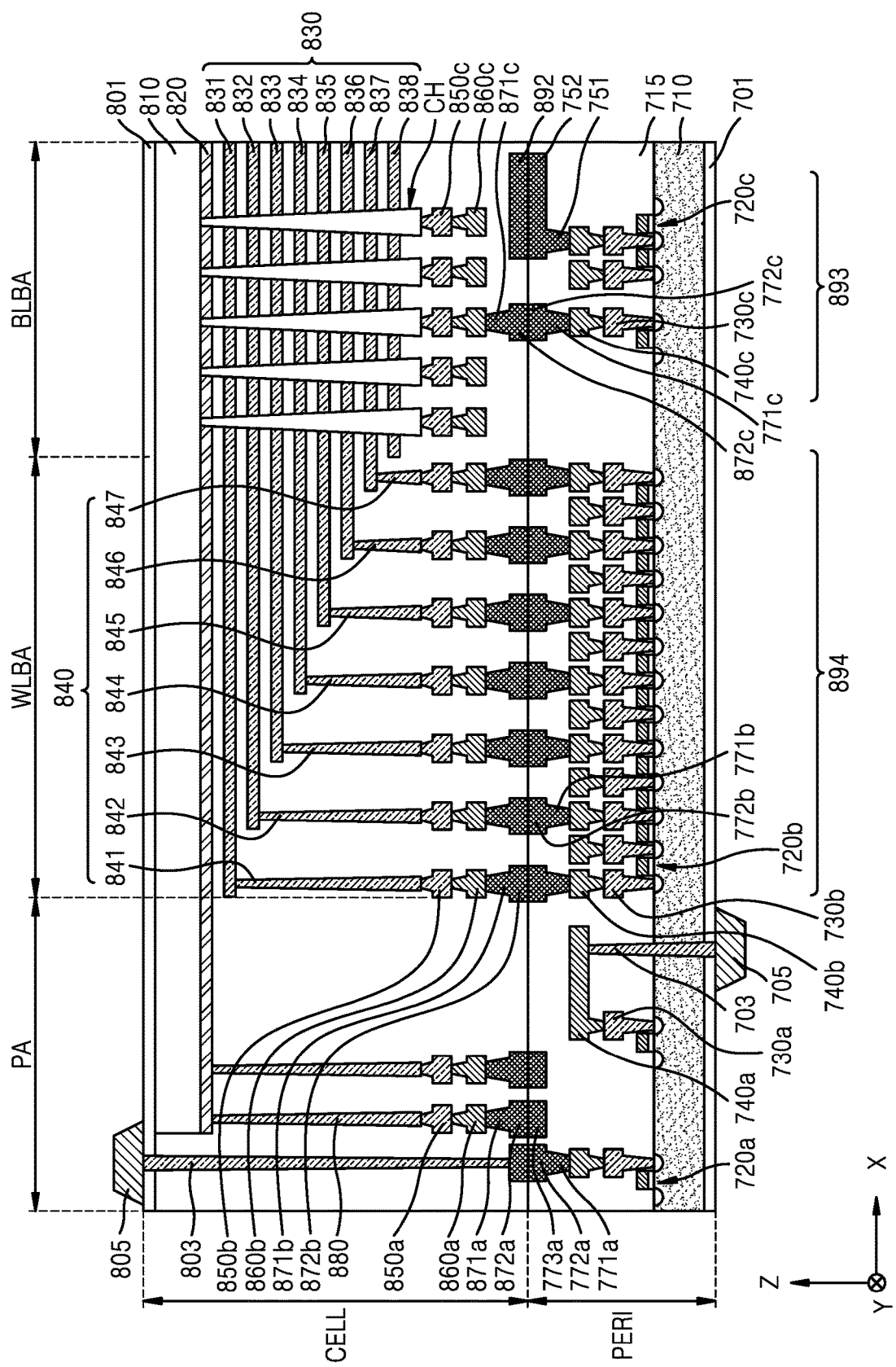
FIG. 21 illustrates a memory device having a chip-to-chip structure, according to embodiments.

FIG. 21 illustrates a memory device having a chip-to-chip structure, according to embodiments.

Referring to FIG. 21, a memory device 900 may have a chip-to-chip (C2C) structure. The C2C structure may refer to a structure formed by manufacturing an upper chip including a cell region (i.e., a memory cell region) CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a copper-to-copper (Cu—Cu) bonding. The present invention, however, is not limited thereto. In an example embodiment, the bonding metals may be formed of aluminum or tungsten.

Each of the peripheral circuit region PERI and the cell region CELL of the memory device 900 may include an external pad bonding area PA, a word line bonding area WLBA, and a bit line bonding area BLBA.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In an example embodiment, the first metal layers 730a, 730b, and 730c may be formed of tungsten, and the second metal layers 740a, 740b, and 740c may be formed of copper. The resistivity of tungsten is higher than that of copper.

In an example embodiment illustrate in FIG. 21, although the first metal layers 730a, 730b, and 730c and the second metal layers 740a, 740b, and 740c are shown and described, they are not limited thereto, and one or more metal layers may be further formed on the second metal layers 740a, 740b, and 740c. At least a portion of the one or more metal layers formed on the second metal layers 740a, 740b, and 740c may be formed of metal such as aluminum or the like. The metal of the one or more metal layers may have resistivity lower than that of copper forming the second metal layers 740a, 740b, and 740c.

The interlayer insulating layer 715 may be disposed on the first substrate 710 and cover the plurality of circuit elements 720a, 720b, and 720c, the first metal layers 730a, 730b, and 730c, and the second metal layers 740a, 740b, and 740c. The interlayer insulating layer 715 may include an insulating material such as silicon oxide, silicon nitride, or the like.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically connected to upper bonding metals 871b and 872b in a bonding manner, and the lower bonding metals 771b and 772b and the upper bonding metals 871b and 872b may be formed of aluminum, copper, tungsten, or the like. Furthermore, the upper bonding metals 871b and 872b in the cell region CELL may be referred as first metal pads and the lower bonding metals 771b and 772b in the peripheral circuit region PERI may be referred as second metal pads.

The cell region CELL may include at least one memory block. The cell region CELL may include a second substrate 810 and a common source line 820. On the second substrate 810, a plurality of word lines 831 to 838 (i.e., 830) may be stacked in a direction (a Z-axis direction), perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction, perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In an example embodiment, the bit line 860c may extend in a first direction (a Y-axis direction), parallel to the upper surface of the second substrate 810.

In an example embodiment illustrated in FIG. 21, an area in which the channel structure CH, the bit line 860c, and the like are disposed may be defined as the bit line bonding area BLBA. In the bit line bonding area BLBA, the bit line 860c may be electrically connected to the circuit elements 720c providing a page buffer 893 in the peripheral circuit region PERI. For example, the bit line 860c may be connected to upper bonding metals 871c and 872c in the cell region CELL, and the upper bonding metals 871c and 872c may be connected to lower bonding metals 771c and 772c connected to the circuit elements 720c of the page buffer 893.

In the word line bonding area WLBA, the plurality of word lines 830 may extend in a second direction (an X-axis direction), parallel to the upper surface of the second substrate 810, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the second direction. A first metal layer 850b and a second metal layer 860b may be connected to an upper portion of the plurality of cell contact plugs 840 connected to the plurality of word lines 830, sequentially. The plurality of cell contact plugs 840 may be connected to the circuit region PERI by the upper bonding metals 871b and 872b of the cell region CELL and the lower bonding metals 771b and 772b of the peripheral circuit region PERI in the word line bonding area WLBA.

The plurality of cell contact plugs 840 may be electrically connected to the circuit elements 720b providing a row decoder 894 in the peripheral circuit region PERI. In an example embodiment, operating voltages of the circuit elements 720b providing the row decoder 894 may be different than operating voltages of the circuit elements 720c providing the page buffer 893. For example, operating voltages of the circuit elements 720c providing the page buffer 893 may be greater than operating voltages of the circuit elements 720b providing the row decoder 894.

A common source line contact plug 880 may be disposed in the external pad bonding area PA. The common source line contact plug 880 may be formed of a conductive material such as a metal, a metal compound, polysilicon, or the like, and may be electrically connected to the common source line 820. A first metal layer 850a and a second metal layer 860a may be stacked on an upper portion of the common source line contact plug 880, sequentially. For example, an area in which the common source line contact plug 880, the first metal layer 850a, and the second metal layer 860a are disposed may be defined as the external pad bonding area PA.

Input-output pads 705 and 805 may be disposed in the external pad bonding area PA. Referring to FIG. 21, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720a, 720b, and 720c disposed in the peripheral circuit region PERI through a first input-output contact plug 703, and may be separated from the first substrate 710 by the lower insulating film 701. In addition, a side insulating film may be disposed between the first input-output contact plug 703 and the first substrate 710 to electrically separate the first input-output contact plug 703 and the first substrate 710.

Referring to FIG. 21, an upper insulating film 801 covering the upper surface of the second substrate 810 may be formed on the second substrate 810, and a second input-output pad 805 may be disposed on the upper insulating film 801. The second input-output pad 805 may be connected to at least one of the plurality of circuit elements 720a, 720b, and 720c disposed in the peripheral circuit region PERI through a second input-output contact plug 803. For example, the second input-output contact plug 803 may be connected to the circuit element 720a through lower bonding metals 771a and 772a.

According to embodiments, the second substrate 810 and the common source line 820 are not disposed in an area in which the second input-output contact plug 803 is disposed. Also, the second input-output pad 805 does not overlap the word lines 830 in the third direction (the Z-axis direction). Referring to FIG. 21, the second input-output contact plug 803 may be separated from the second substrate 810 in a direction, parallel to the upper surface of the second substrate 810, and may pass through the interlayer insulating layer 815 of the cell region CELL to be connected to the second input-output pad 805.

According to embodiments, the first input-output pad 705 and the second input-output pad 805 may be selectively formed. For example, the memory device 900 may include only the first input-output pad 705 disposed on the first substrate 710 or may include only the second input-output pad 805 disposed on the second substrate 810. Alternatively, the memory device 900 may include both the first input-output pad 705 and the second input-output pad 805.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 900 may include a lower metal pattern 773a in an uppermost metal layer of the peripheral circuit region PERI. The lower metal pattern 773a may correspond to an upper metal pattern 872a formed in an uppermost metal layer of the cell region CELL, and may have the same shape as the upper metal pattern 872a of the cell region CELL which is an uppermost metal layer of the cell region CELL. In the peripheral circuit region PERI, the lower metal pattern 773a formed in the uppermost metal layer of the peripheral circuit region PERI is not connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the cell region CELL by a Cu—Cu bonding.

Furthermore, in the bit line bonding area BLBA, an upper metal pattern 892, corresponding to a lower metal pattern 752 formed in the uppermost metal layer of the peripheral circuit region PERI, and having the same shape as the lower metal pattern 752 of the peripheral circuit region PERI, may be formed in an uppermost metal layer of the cell region CELL. A contact is not formed on the upper metal pattern 892 formed in the uppermost metal layer of the cell region CELL. For example, the lower metal pattern 752 may be connected to the circuit element 720c through a lower bonding metal 751.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

Figure 22:
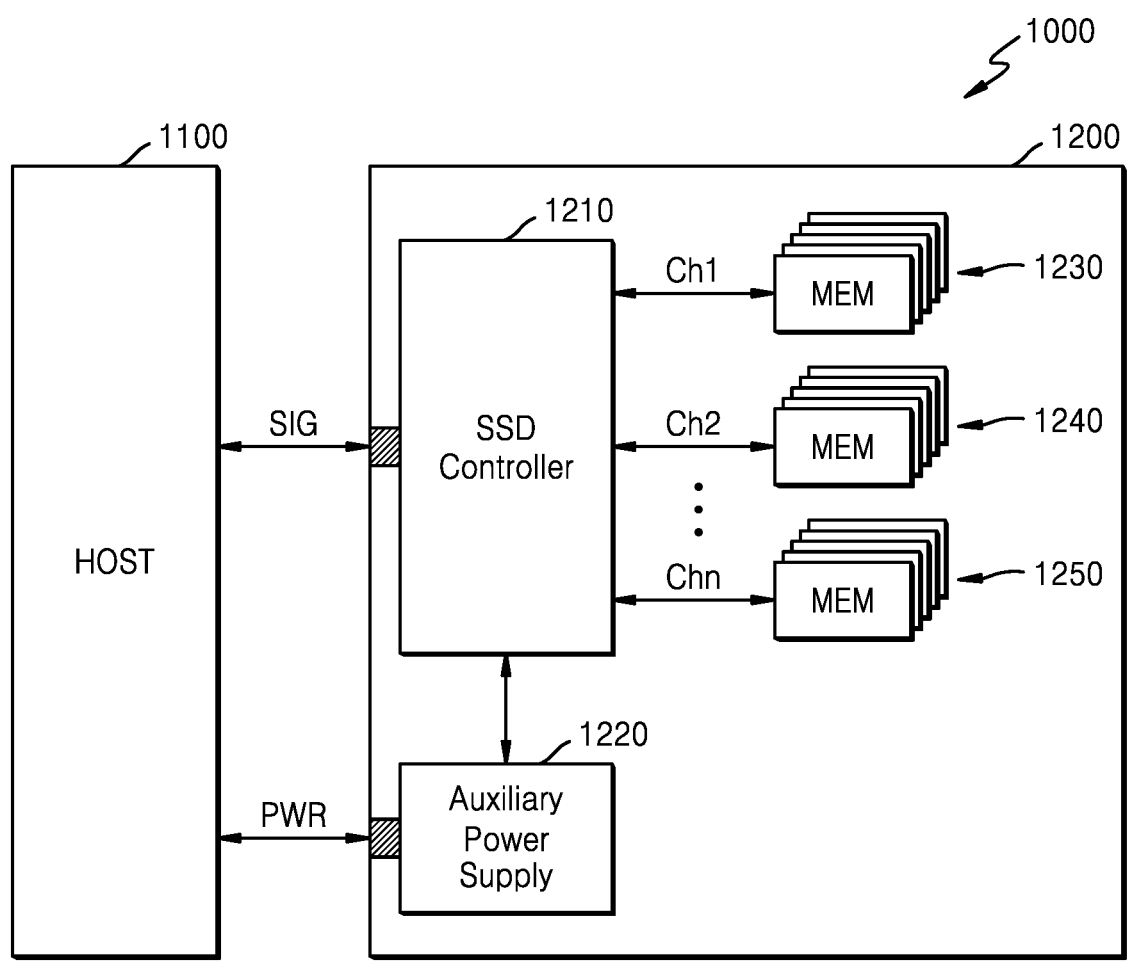
FIG. 22 is a block diagram of an example of applying a memory system to a solid state drive (SSD) system, according to embodiments.

FIG. 22 is a block diagram of an example of applying a memory system to an SSD system, according to embodiments. Referring to FIG. 22, an SSD system 1000 may include a host 1100 and an SSD 1200. The SSD 1200 may exchange signals SIG with the host 1100 through a signal connector and may receive power PWR through a power connector. The SSD 1200 may include an SSD controller 1210, an auxiliary power supply 1220, and memory devices 1230, 1240, and 1250. The memory devices 1230, 1240, and 1250 may be connected to the SSD controller 1210 through channels Ch1, Ch2, and Chn, respectively.

The SSD controller 1210 may control the memory devices 1230, 1240, and 1250 in response to a signal SIG received from the host 1100. The SSD controller 1210 may be implemented using the memory controller 100 described above with reference to FIGS. 1 through 21. For example, when SPO occurs during programming of multi-bit data, the SSD controller 1210 may control the memory devices 1230, 1240, and 1250 such that state group data corresponding to the multi-bit data is backed up. The SSD controller 1210 may control the memory devices 1230, 1240, and 1250 such that the multi-bit data is recovered based on the backed-up state group data after a power recovery. Accordingly, even when SPO occurs during a program operation on multi-bit data, the program operation may be normally completed.

The memory devices 1230, 1240, and 1250 may operate under the control of the SSD controller 1210. Each of the memory devices 1230, 1240, and 1250 may be implemented using the NVM device 200 described above with reference to FIGS. 1 through 21. For example, each of the memory devices 1230, 1240, and 1250 may back up state group data under the control of the SSD controller 1210 when SPO occurs. Each of the memory devices 1230, 1240, and 1250 may read preprogrammed multi-bit data based on the backed-up state group data under the control of the SSD controller 1210 after a power recovery.

The auxiliary power supply 1220 may be connected to the host 1100 through the power connector. The auxiliary power supply 1220 may receive the power PWR from the host 1100 and may be charged. The auxiliary power supply 1220 may supply power to the SSD 1200 when power is not smoothly supplied from the host 1100.

Figure 23:
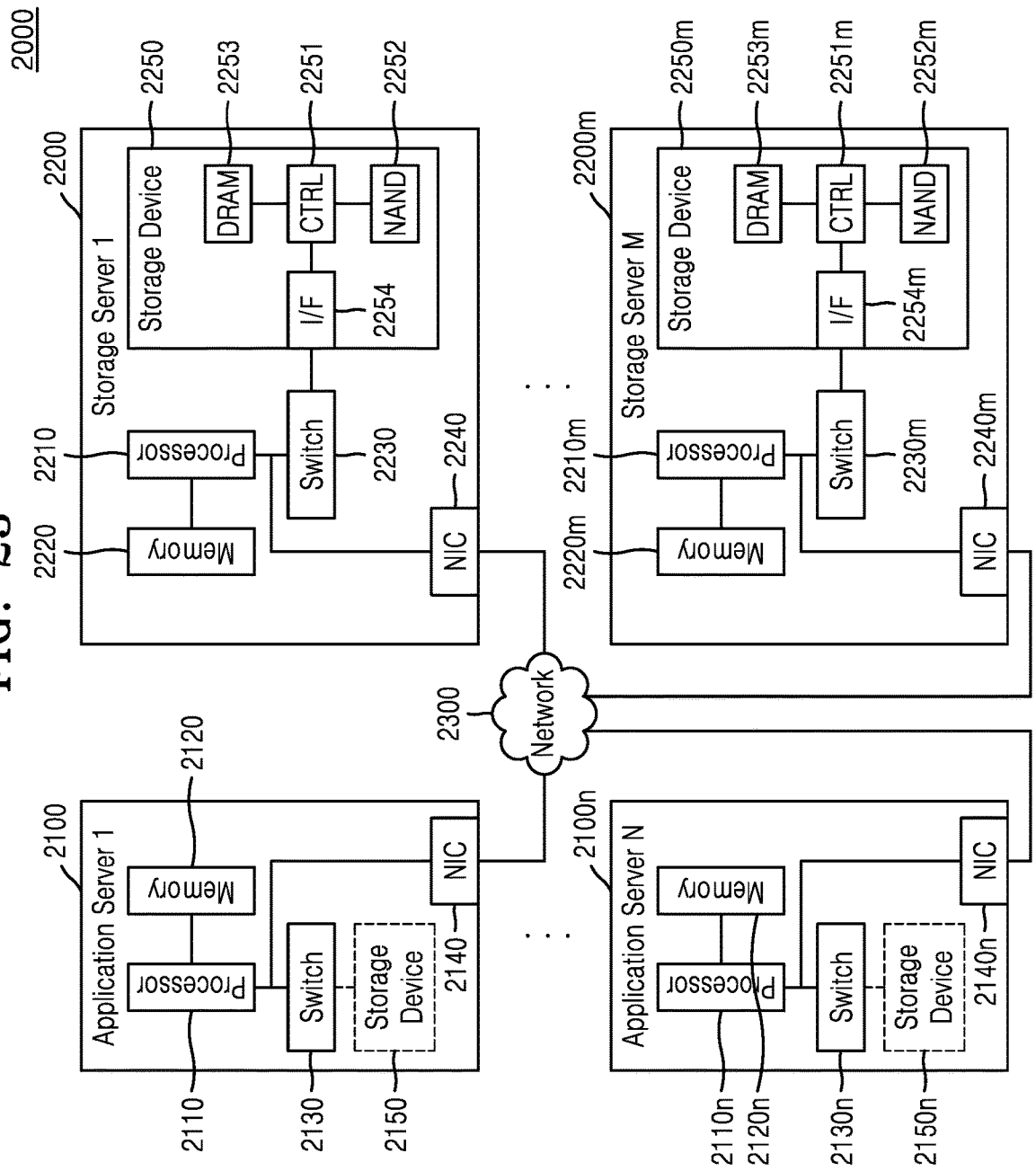
FIG. 23 is a block diagram of a network system using a memory system, according to an embodiment.

FIG. 23 is a block diagram of a network system using a memory system, according to an embodiment. Referring to FIG. 23, a network system 2000 is a facility, which saves various kinds of data and provides services, and may be referred to as a data center or a data storage center. The network system 2000 may include application servers 2100 through 2100n and storage servers 2200 through 2200m. The application servers 2100 through 2100n and the storage servers 2200 through 2200m may be referred to as computing nodes. The number of application servers 2100 through 2100n and the number of storage servers 2200 through 2200m may vary with embodiments and may be different from each other.

The application servers 2100 through 2100n and the storage servers 2200 through 2200m may communicate with one another through a network 2300. The network 2300 may be implemented using a fibre channel (FC) or Ethernet. At this time, the FC is a medium used for high-speed data transmission and may use an optical switch providing high performance and/or high availability. According to the access method of the network 2300, the storage servers 2200 through 2200m may be provided as file storages, block storages, or object storages.

In an example embodiment, the network 2300 may be for storage only, like a storage area network (SAN). For example, the SAN may include an FC-SAN, which uses an FC network and is implemented according to an FC protocol (FCP). In an example embodiment, the SAN may include an IP-SAN, which uses a transmission control protocol/internet protocol (TCP/IP) network and is implemented according to an Internet small computer systems interface (iSCSI) (or an SCSI over TCP/IP) protocol. In an example embodiment, the network 2300 may include a normal network such as a TCP/IP network. For example, the network 2300 may be implemented according to a protocol such as an FC over Ethernet (FCoE) protocol, a network attached storage (NAS) protocol, an NVM express over fabrics (NVMe-oF) protocol.

Hereinafter, descriptions will be focused on the application server 2100 and the storage server 2200. The descriptions of the application server 2100 may also be applied to the other application server 2100n, and the descriptions of the storage server 2200 may also be applied to the other storage server 2200m.

The application server 2100 may include a processor 2110 and a memory 2120. The processor 2110 may control all operations of the application server 2100 and may access the memory 2120 and execute instructions and/or data loaded to the memory 2120. According to an embodiment, the numbers of processors 2110 and memories 2120 included in the application server 2100 may vary. In an example embodiment, the processor 2110 and the memory 2120 may form a processor-memory pair. In an example embodiment, the number of processors 2110 may be different from the number of memories 2120.

The application server 2100 may further include a storage device 2150. At this time, the number of storage devices 2150 included in the application server 2100 may vary with embodiments. The processor 2110 may provide a command to the storage device 2150, and the storage device 2150 may operate in response to the command received from the processor 2110. However, embodiments are not limited thereto, and the application server 2100 may not include the storage device 2150.

The application server 2100 may further include a switch (i.e., a switch logic circuit) 2130 and a network interface card (NIC) 2140. The switch 2130 may selectively connect the processor 2110 or the NIC 2140 to the storage device 2150 under the control of the processor 2110. The NIC 2140 may include a wired interface, a wireless interface, a Bluetooth interface, an optical interface, or the like. In an example embodiment, the processor 2110 and the NIC 2140 may be integrated with each other. In an example embodiment, the storage device 2150 and the NIC 2140 may be integrated with each other.

The application server 2100 may store data, which is requested by a user or a client to store, in one of the storage servers 2200 through 2200m through the network 2300. The application server 2100 may also acquire data, which is requested by a user or a client to read, from one of the storage servers 2200 through 2200m through the network 2300. For example, the application server 2100 may include a web server or a database management system (DBMS).

The application server 2100 may access a memory 2120n or a storage device 2150n, each included in the application server 2100n, a memory 2220 or a storage device 2250, each included in the storage server 2200, or a memory 2220m or a storage device 2250m, each included in the storage server 2200m, through the network 2300. Accordingly, the application server 2100 may perform various operations on data stored in the application servers 2100 and 2100n and/or the storage servers 2200 and 2200m. For example, the application server 2100 may execute an instruction for moving or copying data among the application servers 2100 and 2100n and/or the storage servers 2200 and 2200m. In this case, the data may be moved in an encrypted state through the network 2300 for security or privacy.

The storage server 2200 may include a processor 2210 and the memory 2220. The processor 2210 may control all operations of the storage server 2200 and may access the memory 2220 and execute instructions and/or data loaded to the memory 2220. According to an embodiment, the numbers of processors 2210 and memories 2220 included in the storage server 2200 may vary. In an example embodiment, the processor 2210 and the memory 2220 may form a processor-memory pair. In an example embodiment, the number of processors 2210 may be different from the number of memories 2220.

The processor 2210 may include a single-core processor or a multi-core processor. For example, the processor 2210 may include a general-purpose processor, a central processing unit (CPU), a graphics processing unit (GPU), a digital signal processor (DSP), a microcontroller unit (MCU), a microprocessor, a network processor, an embedded processor, a field programmable gate array (FPGA), an application-specific instruction set processor (ASIP), an application-specific integrated circuit (ASIC) processor, or the like.

The storage server 2200 may further include at least one storage device 2250. The number of storage devices 2250 included in the storage server 2200 may vary with embodiments. The storage device 2250 may include a controller (CTRL) 2251, NAND flash (NAND) 2252, DRAM 2253, and interface (I/F) 2254. The configuration and operations of the storage device 2250 will be described in detail below. The descriptions of the storage device 2250 below may also be applied to the other storage devices 2150, 2150n, and 2250m.

The interface 2254 may provide a physical connection between the processor 2210 and the controller 2251 and a physical connection between an NIC 2240 and the controller 2251. For example, the interface 2254 may be implemented by a direct attached storage (DAS) method for directly connecting the storage device 2250 using a dedicated cable. For example, the interface 2254 may be implemented by various interface methods such as an ATA interface, a SATA interface, an e-SATA interface, an SCSI, a SAS, a PCI interface, a PCIe interface, an NVMe interface, IEEE 1394, a USB interface, an SD card interface, an MMC interface, an eMMC interface, and a CF card interface.

The controller 2251 may control all operations of the storage device 2250. The controller 2251 may program data to the NAND flash 2252 in response to a program command and may read data from the NAND flash 2252 in response to a read command. For example, the program command and/or the read command may be provided through the processor 2110 or directly from the processor 2210 of the storage server 2200, a processor 2210m of the storage server 2200m, the processor 2110 of the application server 2100, or a processor 2110n of the application server 2100n.

The NAND flash 2252 may include a plurality of NAND flash memory cells. However, embodiments are not limited thereto. The storage device 2250 may include NVM, e.g., RRAM, PRAM, or MRAM, other than the NAND flash 2252, a magnetic storage medium, or an optical storage medium.

The DRAM 2253 may be used as buffer memory. For example, the DRAM 2253 may include double data rate synchronous DRAM (DDR SDRAM), low power DDR (LPDDR) SDRAM, graphics DDR (GDDR) SDRAM, Rambus DRAM (RDRAM), or high bandwidth memory (HBM). However, embodiments are not limited thereto, and the storage device 2250 may use other volatile memory than DRAM or NVM as buffer memory. The DRAM 2253 may temporarily store (or buffer) data to be programmed to the NAND flash 2252 or data read from the NAND flash 2252.

The storage server 2200 may further include a switch 2230 and an NIC 2240. The switch 2230 may selectively connect the processor 2210 or NIC 2240 to the storage device 2250 under the control of the processor 2210. In an example embodiment, the processor 2210 and the NIC 2240 may be integrated with each other. In an example embodiment, the storage device 2250 and the NIC 2240 may be integrated with each other.

Each of the storage devices 2150, 2150n, 2250, and 2250m may correspond to the memory system 10 described above with reference to FIGS. 1 through 20. For example, the storage device 2250 may operate according to a multi-page data program command from one of the processors 2110, 2110n, 2210, and 2210m. When the storage device 2250 operates according to a program command from one of the processors 2110, 2110n, 2210, and 2210m, the storage device 2250 may receive the program command through the processor 2210 or may receive the program command directly from a processor connected through the switch 2230. The controller 2251 may control the NAND flash 2252 to store multi-page data in response to the program command. For example, when SPO occurs during a program operation on multi-page data (e.g., when SPO occurs in the storage server 2200), the storage device 2250 may back up state group code corresponding to the multi-page data to the NAND flash 2252. When power is recovered from SPO, the storage device 2250 may recover preprogrammed multi-page data based on the backed-up state group code. The storage device 2250 may complete the program operation on the multi-page data by performing a reprogram operation based on the recovered multi-page data.

While the inventive concept has been particularly shown and described with reference to embodiments thereof, it will be understood that various changes in form and details may be made therein without departing from the spirit and scope of the following claims.

What is claimed is:

1. An operating method of a nonvolatile memory device, the operating method comprising:
   receiving a preprogram command and multi-page data from a memory controller, wherein the multi-page data includes a plurality of multi-bit data;
   preprogramming the multi-page data to a plurality of memory cells connected to a first word line of the nonvolatile memory device, in response to the preprogram command, wherein each of the plurality of memory cells is preprogrammed to have a threshold voltage according to a corresponding one of the plurality of multi-bit data, and wherein the threshold voltage corresponds to one of a plurality of preprogrammed states;
   generating a state group code based on the plurality of multi-bit data of the multi-page data, wherein the state group code includes a plurality of state group data, and wherein each of the plurality of state group data has less number of bits than a corresponding one of the plurality of multi-bit data of the multi-page data; and
   backing up the state group code to the nonvolatile memory device when sudden power-off occurs after the plurality of memory cells are preprogrammed.

2. The operating method of claim 1,
   wherein the plurality of preprogrammed states are grouped into N state groups,
   wherein each of the N state groups has M preprogrammed states of the plurality of preprogrammed states, M having a number amounting to a number of the plurality of preprogrammed states divided by N, M and N being integer numbers, and
   wherein each of the plurality of state group data represents a corresponding one of the N state groups.

3. The operating method of claim 1, wherein the generating of the state group code comprising:
   generating each of the plurality of state group data through a logic operation on bits in a corresponding one of the plurality of multi-bit data.

4. The operating method of claim 1, further comprising:
   receiving a state group code generation command from the memory controller,
   wherein the state group code is generated by the nonvolatile memory device in response to the state group code generation command.

5. The operating method of claim 1, wherein the backing up of the state group code to the nonvolatile memory device is performed by programming the state group code in a single-level cell (SLC) mode to the nonvolatile memory device.

6. The operating method of claim 1, further comprising:
   receiving a state group code output command from the memory controller; and
   transmitting the state group code to the memory controller in response to the state group code output command.

7. The operating method of claim 1, further comprising:
   receiving a state group code backup command from the memory controller,
   wherein the state group code is backed up in response to the state group code backup command.

8. An operating method of a nonvolatile memory device, the operation method comprising:
   receiving a first read command from a memory controller, when power is recovered from sudden power-off;
   reading a state group code in response to the first read command, wherein the state group code includes a plurality of state group data;
   receiving a second read command from the memory controller;
   reading multi-page data, including a plurality of multi-bit data which are preprogrammed, from a plurality of first memory cells connected to a first word line of the nonvolatile memory device, based on the state group code, in response to the second read command; and
   reprogramming the multi-page data to a plurality of second memory cells included in the nonvolatile memory device,
   wherein each of the plurality of state group data has less number of bits than a corresponding one of a plurality of multi-bit data of the multi-page data.

9. The operating method of claim 8, wherein the plurality of first memory cells are different from the plurality of second memory cells.

10. The operating method of claim 8, wherein the plurality of first memory cells are the same as the plurality of second memory cells.

11. The operating method of claim 8, wherein the reading of the multi-page data from the plurality of first memory cells includes:
    setting a read operation of the nonvolatile memory device to a recovery read mode; and
    applying first read voltages to the first word line connected to the plurality of first memory cells, which are preprogrammed, in the recovery read mode, the first read voltages being determined based on each of the plurality of state group data.

12. The operating method of claim 11, wherein read voltage levels of the first read voltages applied to the first word line to read the multi-page data in the recovery read mode are different from read voltage levels of second read voltages applied to the first word line to read the multi-page data in a normal read mode.

13. The operating method of claim 11, wherein the first read voltages have first read voltage levels corresponding to a first state group data among the plurality of state group data and second read voltage levels, different from the first read voltage levels, corresponding to a second state group data among the plurality of state group data.

14. The operating method of claim 11, wherein a number of read voltage levels applied to the first word line according to a read command in the recovery read mode is greater than a number of read voltage levels applied to the first word line according to a read command in a normal read mode.

15. The operating method of claim 11, wherein voltage levels of the first read voltages applied to the first word line are regulated according to whether a memory cell connected to a second word line which is adjacent to the first word line is in a preprogrammed state.

16. The operating method of claim 8, wherein a program verify voltage for the reprogramming is higher than a program verify voltage for preprogramming.

17. The operating method of claim 8, wherein the reprogramming of the multi-page data includes:
- correcting an error in the multi-page data read from the plurality of first memory cells which are preprogrammed; and
- reprogramming the corrected multi-page data to the plurality of second memory cells.

18. The operating method of claim 8, wherein before the sudden power-off, each of the plurality of first memory cells is preprogrammed to have a threshold voltage according to a corresponding one of the plurality of multi-bit data, and
- wherein the threshold voltage corresponds to one of a plurality of preprogrammed states.

19. The operating method of claim 8, wherein before the sudden power-off, the state group code is generated based on the plurality of multi-bit data of the multi-page data.

20. An operating method of a nonvolatile memory device, the nonvolatile memory device including a memory cell region including a first metal pad, and a peripheral circuit region including a second metal pad and vertically connected to the memory cell region by the first metal pad and the second metal pad, the operating method comprising:
- receiving a preprogram command and multi-page data from a memory controller, wherein the multi-page data includes a plurality of multi-bit data;
- preprogramming the multi-page data to a plurality of memory cells connected to a first word line of the nonvolatile memory device, in response to the preprogram command, wherein each of the plurality of memory cells is preprogrammed to have a threshold voltage according to a corresponding one of the plurality of multi-bit data, and wherein the threshold voltage corresponds to one of a plurality of preprogrammed states;
- generating a state group code based on the plurality of multi-bit data of the multi-page data, wherein the state group code includes a plurality of state group data, and wherein each of the plurality of state group data has less number of bits than a corresponding one of the plurality of multi-bit data of the multi-page data; and
- backing up the state group code to the nonvolatile memory device when sudden power-off occurs after the memory cells are preprogrammed.

* * * * *